(12) United States Patent
Shinzato

(10) Patent No.: US 10,419,676 B2
(45) Date of Patent: Sep. 17, 2019

(54) VIBRATION-TYPE ACTUATOR THAT DRIVES VIBRATING BODY IN COMBINATION OF TWO BENDING VIBRATION MODES, AND ELECTRONIC APPARATUS

(71) Applicant: CANON KABUSHIKI KAISHA, Tokyo (JP)

(72) Inventor: Yuki Shinzato, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 227 days.

(21) Appl. No.: 15/400,266

(22) Filed: Jan. 6, 2017

(65) Prior Publication Data
US 2017/0208253 A1    Jul. 20, 2017

(30) Foreign Application Priority Data

Jan. 15, 2016    (JP) .................................. 2016-006092

(51) Int. Cl.

| H01L 41/04 | (2006.01) |
|---|---|
| H04N 5/232 | (2006.01) |
| G02B 7/09 | (2006.01) |
| H01L 41/09 | (2006.01) |
| H01L 41/25 | (2013.01) |
| H02N 2/00 | (2006.01) |
| H02N 2/02 | (2006.01) |

(52) U.S. Cl.
CPC ........... *H04N 5/23287* (2013.01); *G02B 7/09* (2013.01); *H01L 41/042* (2013.01); *H01L 41/0926* (2013.01); *H01L 41/25* (2013.01); *H02N 2/0015* (2013.01); *H02N 2/026* (2013.01)

(58) Field of Classification Search
CPC . H01L 41/042; H01L 41/0926; H02N 2/0015; H02N 2/026
USPC ........................................ 310/323.01–323.21
See application file for complete search history.

(56) References Cited

U.S. PATENT DOCUMENTS

| 7,109,639 | B2 | 9/2006 | Yamamoto et al. |
|---|---|---|---|
| 7,187,104 | B2 | 3/2007 | Yamamoto et al. |
| 2017/0005595 | A1* | 1/2017 | Nishitani ............... H02N 2/026 |
| 2017/0133579 | A1* | 5/2017 | Suefuji ................ H02N 2/0015 |

FOREIGN PATENT DOCUMENTS

| JP | 3363510 B2 | 1/2003 |
|---|---|---|
| JP | 2006-115559 A | 4/2006 |
| JP | 4261964 B2 | 5/2009 |

* cited by examiner

*Primary Examiner* — Derek J Rosenau
(74) *Attorney, Agent, or Firm* — Venable LLP

(57) ABSTRACT

A vibration-type actuator is downsized and stably holds the position of a vibrating body. In the vibrating body, it is possible to excite vibrations in a first bending vibration mode with two nodal lines that do not cross each other but cross short sides of an elastic body, and no nodal line that connects two long sides of the elastic body together, and a second bending vibration mode in which amplitude peaks of vibration in an out-of-plane direction of a flat-shaped plane of the elastic body lie in six respective areas formed by dividing the flat-shaped plane, and in the adjoining areas, vibrations at the amplitude peaks are in opposite phases. Combined vibrations in the first and second bending vibration modes cause an oval motion of the projecting portion, moving the vibrating body and a driven body relatively to each other in a lateral direction of the elastic body.

20 Claims, 15 Drawing Sheets

MODE A
(FIRST BENDING
VIBRATION MODE)

MODE B
(SECOND BENDING
VIBRATION MODE)

MODE A
(XY PLANE)

MODE A
(ZX PLANE)

MODE B
(XY PLANE)

MODE B
(ZX PLANE)

- PRESSURIZING FORCE F = (0, 0, Fz)
- PRESSURIZING FORCE Fi RECEIVED BY POINT OF CONTACT ai
  Fi = (0, 0, Fzi) (Fzi ≥ 0, i=1, 2, ...)
- POSITION zi OF EACH POINT OF CONTACT IN Z DIRECTION
  zi = z1 (i = 1, 2, ...)

MODE A

MODE B

MODE A
(XY PLANE)

MODE A
(ZX PLANE)

MODE A

MODE B

VIBRATION-TYPE ACTUATOR THAT DRIVES VIBRATING BODY IN COMBINATION OF TWO BENDING VIBRATION MODES, AND ELECTRONIC APPARATUS

BACKGROUND OF THE INVENTION

Field of the Invention

The present invention relates to a vibration-type actuator that drives a vibrating body in a combination of two bending vibration modes, and an electronic apparatus having the vibration-type actuator.

Description of the Related Art

There are known a variety of vibration-type actuators which bring a driven body into pressure contact with a vibrating body, which is constructed by joining an electromechanical energy conversion element such as a piezoelectric element to an elastic body, and move the vibrating body and the driven body relatively to each other through driving vibrations excited in the vibrating body. For such vibration-type actuators, a driving method using a combination of two bending vibration modes for exciting driving vibrations in the vibrating body is known.

Japanese Patent Publication No. 4261964 discloses a vibrating body that has a rectangular flat-shaped elastic body, a piezoelectric element joined to one surface of the elastic body, and two projecting portions provided with a predetermined space left therebetween in a longitudinal direction in a central part of the other surface of the elastic body in a lateral direction such that the two projecting portions project in a thickness direction of the elastic body. By applying voltage to the piezoelectric element, oval motions are generated in upper end faces of the projecting portions within a plane including both of the thickness direction and the longitudinal direction of the elastic body. Thus, by bringing the driven body and the upper end faces of the projecting portions into pressure contact with each other in the thickness direction of the elastic body, the vibrating body and the driven body are moved relatively to each other in the longitudinal direction of the elastic body (direction that connects the two projecting portions together).

Japanese Patent Publication No. 3363510 discloses a first vibrating body that has a rectangular flat-shaped elastic body, a piezoelectric element joined to one surface of the elastic body, and two prismatic projecting portions provided with a predetermined space left therebetween in a longitudinal direction in a central part of the other surface of the elastic body in a lateral direction such that the two projecting portions project in a thickness direction of the elastic body. By applying voltage to the piezoelectric element, oval motions are generated in upper end faces of the projecting portions within a plane including both of the thickness direction and the longitudinal direction of the elastic body (within a plane perpendicular to the lateral direction of the elastic body). Thus, by bringing the driven body into pressure contact with ends of surfaces of the projecting portions, which are perpendicular to the lateral direction of the elastic body, in the thickness direction of the elastic body, the first vibrating body and the driven body are moved relatively to each other in the longitudinal direction of the elastic body.

Japanese Patent Publication No. 3363510 also discloses a second vibrating body that has a rectangular flat-shaped elastic body, a piezoelectric element joined to one surface of the elastic body, and a total of four prismatic projecting portions each pair of which is provided with a predetermined space left therebetween in a longitudinal direction on each long side of the other surface of the elastic body. By applying voltage to the piezoelectric element, oval motions are generated in upper end faces of the projecting portions within a plane including both of the thickness direction and the longitudinal direction of the elastic body. Thus, by bringing the driven body into pressure contact with the upper end faces of the projecting portions, the second vibrating body and the driven body are moved relatively to each other in the longitudinal direction of the elastic body.

Japanese Laid-Open Patent Publication (Kokai) No. 2006-115559 discloses a vibrating body that has a rectangular flat-shaped elastic body, a piezoelectric element joined to one surface of the elastic body, and one projecting portion provided on the other surface of the elastic body such that the projecting portion projects in a thickness direction of the elastic body. By applying voltage to the piezoelectric element, an oval motion is generated in an upper end face of the projecting portion within a plane including both of the thickness direction and the longitudinal direction of the elastic body. Thus, by bringing the driven body into pressure contact with the upper end face of the projecting portion in the thickness direction of the elastic body, the vibrating body and the driven body are moved relatively to each other in the longitudinal direction of the elastic body.

SUMMARY OF THE INVENTION

Accordingly, the present invention provides a vibration-type actuator comprising a vibrating body configured to comprise a rectangular flat-shaped elastic body, an electromechanical energy conversion element that is joined to one surface of the elastic body, and at least one projecting portion that is provided on the elastic body, and a driven body configured to be brought into pressure contact with the vibrating body at an end of the projecting portion, wherein in the vibrating body, vibrations in a first bending vibration mode in which there are two nodal lines that do not cross each other but cross short sides of the elastic body, and there is no nodal line that connects two long sides of the elastic body to each other are excited, and vibrations in a second bending vibration mode in which an amplitude peak of vibration in an out-of-plane direction of a flat-shaped plane of the elastic body is present in each of a total of six areas formed by dividing the flat-shaped plane of the elastic body into two in a lateral direction of the elastic body and dividing the flat-shaped plane of the elastic body into three in a longitudinal direction of the elastic body, and in adjoining areas of the six areas, vibrations at the amplitude peaks are in opposite phases are excited, and wherein driving vibrations obtained by combining vibrations in the first bending vibration mode and the second bending vibration mode generate an oval motion at the end of the projecting portion within a plane perpendicular to the longitudinal direction of the elastic body, causing the vibrating body and the driven body to move relatively to each other in the lateral direction of the elastic body.

Further features of the present invention will become apparent from the following description of exemplary embodiments (with reference to the attached drawings).

DESCRIPTION OF THE EMBODIMENTS

Following embodiments provide a vibration-type actuator that is allowed to be downsized and is able to stably hold the position of a vibrating body, and an electronic apparatus having the vibration-type actuator.

Hereafter, the embodiments will be described in detail with reference to the drawings.

First Embodiment

Figure 1A:
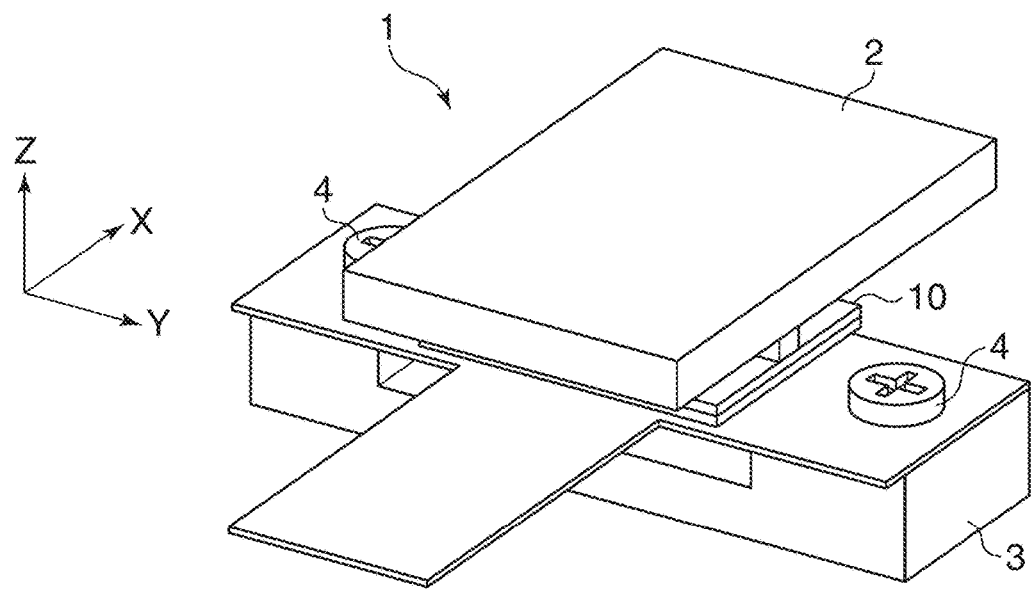
FIG. 1A is a perspective view schematically showing an arrangement of a vibration-type actuator according to a first embodiment of the present invention.
Figure 1B:
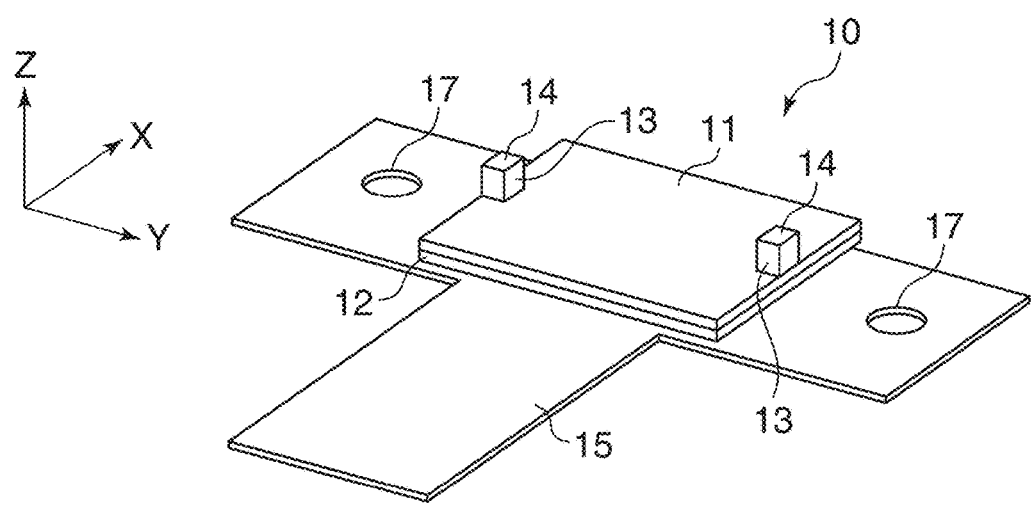
FIG. 1B is an appearance perspective view showing a vibrating body, which constitutes the vibration-type actuator, and its surrounding arrangement.

A description will now be given of a first embodiment of the present invention. FIG. 1A is a perspective view schematically showing an arrangement of a vibration-type actuator 1 according to a first embodiment of the present invention. FIG. 1B is an appearance perspective view showing a vibrating body 10, which constitutes the vibration-type actuator 1, and its surrounding arrangement. The vibration-type actuator 1 has the vibrating body 10 and a driven body 2. The vibrating body 10 has an elastic body 11, a piezoelectric element 12, and two projecting portions 13. The vibrating body 10 is held on a base 3 via a flexible printed circuit-board 15 (hereafter referred to as "the FPC 15").

It should be noted that a three dimensional orthogonal coordinate system (an X direction, a Y direction, and a Z direction) is defined as shown in FIGS. 1A and 1B and will be used for the following description as the need arises. As will be described later, the X direction is a direction in which the driven body 2 and the vibrating body 10 move relatively to each other and is also a lateral direction of the vibrating body 10. The Z direction is a pressurizing direction in which the vibrating body 10 and the driven body 2 are brought into pressure contact with each other. The Y direction is a direction perpendicular to the X direction and the Z direction and is also a longitudinal direction of the vibrating body 10.

The elastic body 11 is made of a metallic material such as SUS420J2, which is martensite stainless steel, and has a rectangular flat shape, a lateral direction of which is the X direction, a longitudinal direction of which is the Y direction, and a thickness direction of which is the Z direction. The two projecting portions 13 are provided at ends of one surface (a surface on the driven body 2 side) of the elastic body 11 in the Y direction and project in the Z direction in substantially a central part of the elastic body 11 in the X direction. One surface (a surface on the elastic body 11 side) of the piezoelectric element 12, which is an electro-mechanical energy conversion element, is joined to the other surface (a surface on the piezoelectric element 12 side) of the elastic body 11. The other surface (a surface on the FPC 15 side) of the piezoelectric element 12 is joined to the FPC 15, a base member of which is made of a resin material such as a polyimide film. Holes 17 are formed in portions of the FPC 15 which extend in the Y direction. By inserting bolts 4 into the holes 17 and tightening the bolts 4, the FPC 15 is fastened to the base 3, and as a result, the vibrating body 10 is held on the base 3 via the FPC 15. Because of this arrangement in which the FPC 15 is fixed to the base 3, any additional supporting member for supporting the vibrating body 10 is dispensed with, and hence parts count and assembly steps are reduced. It should be noted that the FPC 15 is not always fastened to the base 3 with the bolts 4, but any other way such as sandwiching using a retainer plate or bonding using an adhesive agent may be used.

Ends of the projecting portions 13 are contact portions 14 which are brought into pressure contact with the driven body 2 by pressurizing force acting in the Z direction. The way of pressurization to bring the contact portions 14 into pressure contact with the driven body 2 is not particularly limited. For example, elastic force exerted by a spring or the like may be applied from the driven body 2 to the vibrating body 10 or from the vibrating body 10 to the driven body 2, or the FPC 15 may be given elastic force, which in turn is applied to the contact portions 14. Alternatively, a magnetic circuit may be formed between the driven body 2 and the elastic body 11 using a permanent magnet to bring the contact portions 14 and the driven body 2 into pressure contact with each other.

It is preferred that the contact portions 14 have a predetermined friction coefficient and also have high abrasion resistance. Accordingly, for example, the projecting portions 13 are formed integrally with the elastic body 11 by stamping or the like, and the ends of the projecting portions 13 are subjected to thermal treatment and surface grinding. This forms the contact portions 14 with a predetermined friction coefficient and high abrasion resistance. When the projecting portions 13, the contact portions 14, and the elastic body 11 are configured as an integral unit, assembly man-hour is reduced as compared to the case where they are formed separately, and moreover, variations in the dimensions and performance of components are reduced because alignment of the projecting portions 13 is not needed. It should be noted that the method to form the projecting portions 13 and the contact portions 14 is not limited to the above described one, but a variety of manufacturing methods may be used. For example, the projecting portions 13 may be formed by etching or may be manufactured separately from the elastic body 11 and then fixed (joined) to the elastic body 11. The contact portions 14 may be formed by plating or the like.

A description will now be given of two bending vibration modes in which vibrations are excited in the vibrating body 10. In the vibration-type actuator 1, vibrations in the two bending vibration modes are excited in the vibrating body 10, and driving vibrations obtained by combining the excited vibrations generate oval motions, which lay down oval trails in the same direction inside a plane perpendicular to the longitudinal direction of the elastic body 11, in the contact portions 14. As a result, the contact portions 14 apply frictional driving force to the driven body 2 in the X direction, causing the driven body 2 and the vibrating body 10 to move relatively to each other in the X direction.

The shape of the vibrating body 10 is designed so that a difference in resonance frequency between the two bending vibration modes can assume a desired value. Specifically, a difference in resonance frequency between the two bending vibration modes is approximated to a desired value by determining a long-side length, which is a dimension of the vibrating body 10 in the longitudinal direction (Y direction), a short-side length, which is a dimension of the vibrating body 10 in the lateral direction (X direction), and a thickness, which is a dimension of the vibrating body 10 in the thickness direction (Z direction). In the present embodiment, the long-side length, the short-side length, and the thickness are determined to have a ratio of approximately 20:16:1. The shape of the vibrating body 10 is also designed such that the following relationship, $0<\Delta f<fr\times 0.15$, holds where it is assumed that a higher one of resonance frequencies of the two bending vibration modes is fr, and a difference in resonance frequency between the two bending vibration modes is $\Delta f$.

Figure 2A:
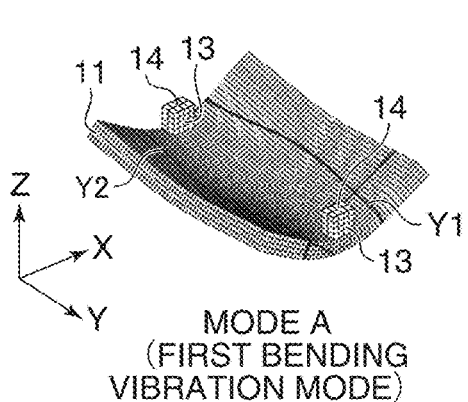
FIGS. 2A and 2B are perspective views useful in explaining two bending vibration modes in which vibrations are excited in the vibrating body in FIGS. 1A and 1B.
Figure 2B:
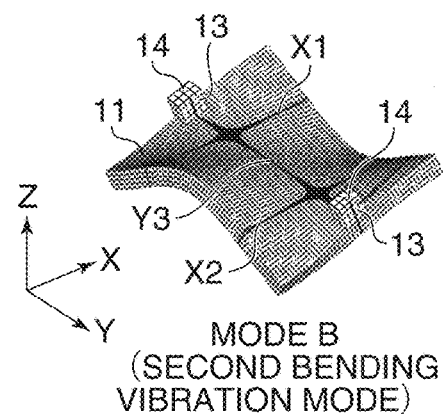
Figure 3A:
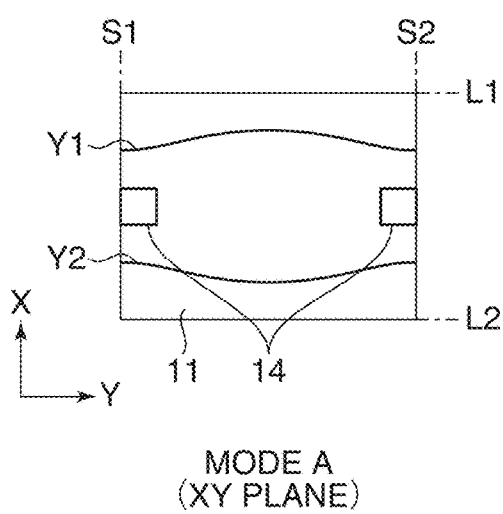
FIGS. 3A and 3B are views useful in explaining how projecting portions and contact portions move as the vibrating body in FIGS. 1A and 1B is deformed through vibrations in the mode A in FIG. 2A.
Figure 3B:
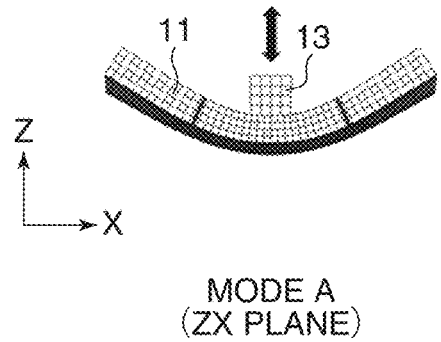
Figure 4A:
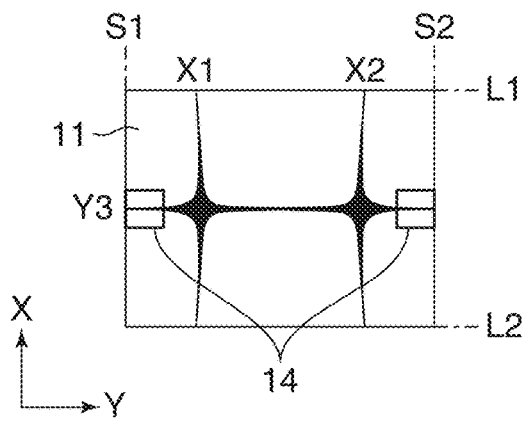
FIGS. 4A and 4B are views useful in explaining how the contact portions move as the vibrating body in FIGS. 1A and 1B is deformed through vibrations in the mode B in FIG. 2B.
Figure 4B:
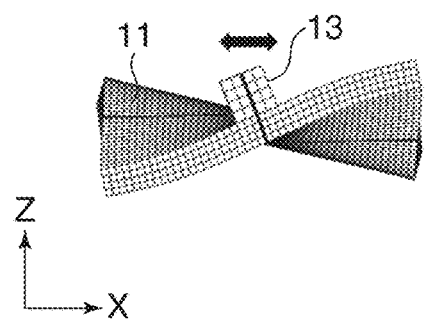

FIGS. 2A and 2B are perspective views useful in explaining the two bending vibration modes in which vibrations are excited in the vibrating body 10. FIG. 2A shows in schematic form how the vibrating body 10 is deformed in the first bending vibration mode (hereafter referred to as "the mode A"), and FIG. 2B shows in schematic form how the vibrating body 10 is deformed in the second bending vibration mode (hereafter referred to as "the mode B"). FIGS. 3A and 3B are views useful in explaining how the projecting portions 13 and the contact portions 14 move as the vibrating body 10 is deformed through vibrations in the mode A, FIG. 3A showing a state as seen from the Z direction, and FIG. 3B showing a state as seen from the Y direction. FIGS. 4A and 4B are views useful in explaining how the projecting portions 13 and the contact portions 14 move as the vibrating body 10 is deformed through vibrations in the mode B, FIG. 4A showing a state as seen from the Z direction, and FIG. 4B showing a state as seen from the Y direction.

Vibrations in the mode A are primary bending vibrations in the X direction and have two nodal lines Y1 and Y2 which are substantially parallel in the direction Y of the elastic body 11. The two nodal lines Y1 and Y2 being substantially parallel mean that the nodal lines Y1 and Y2 are continuous curves, cross two short sides S1 and S2 of the vibrating body 10, and are parallel to each other without crossing each other and crossing long sides L1 and L2 of the elastic body 11. It should be noted that in the two bending vibration modes (the modes A and B), vibrations occur in an out-of-plane direction (Z direction) with respect to an XY plane of the vibrating body 10, and hence in the following description, nodal lines and nodes mean positions at which almost no vibrations in the Z direction occur in the vibrating body 10 (positions at which amplitude is minimum).

The two projecting portions 13 are disposed close to an anti-node of vibrations in the mode A as shown in FIG. 3B, and hence vibrations in the mode A cause the two projecting portions 13 to reciprocate in the same phase in the Z direction. At this time, at locations where the two projecting portions 13 are provided, almost no displacements in the X direction and the Y direction are caused to occur by vibrations in the mode A, but each of the two projecting portions 13 is displaced to the utmost extent in the Z direction. Namely, the contact portions 14 at the ends of the projecting portions 13 are caused to reciprocate to the utmost extent only in the Z direction by vibrations in the mode A.

Vibrations in the mode B are secondary torsional vibrations and have one nodal line Y3 that is substantially parallel to the Y direction of the elastic body 11, and two nodal lines X1 and X2 substantially parallel to the X direction. The two nodal lines X1 and X2 being substantially parallel means that the nodal lines X1 and X2 are continuous curve, cross two long sides L1 and L2 of the elastic body 11, and are parallel to each other without crossing each other and crossing the short sides S1 and S2 of the elastic body 11. The nodal line Y3 being substantially parallel to the Y direction of the elastic body 11 means that the nodal line Y3 is a continuous curve, crosses the two short sides S1 and S2 of the elastic body 11, and is parallel to the long sides L1 and L2 without crossing the long sides L1 and L2. Namely, vibrations in the mode B have amplitude peaks of vibration in an out-of-plane direction of a flat-shaped plane of the elastic body 11 in each of a total of six areas formed by dividing the flat-shaped plane of the elastic body 11 into two in the lateral direction of the elastic body 11 and dividing the flat-shaped plane of the elastic body 11 into three in the longitudinal direction of the elastic body 11. In adjoining areas of these six areas, vibrations at the amplitude peaks are in the opposite phase.

The two projecting portions 13 are disposed close to the nodal line Y3 (substantially the center in the X direction) and close to the short side S1 near the nodal line X1 and the short side S2 near the nodal line X2 as shown in FIG. 4A, and hence they are caused to reciprocate in the X direction in the same phase by vibrations in the mode B. At this time, at locations where the two projecting portions 13 are provided, almost no displacements in the Y direction and the Z direction are caused to occur due to vibrations in the mode B. The displacement of the reciprocating motion in the X direction in the contact portions 14 is magnified at the height of the projecting portions 13. Accordingly, settings should be made using the height of the projecting portions 13 in the Z direction, and each of the contact portions 14 is allowed to be displaced to the utmost extent in the X direction due to the projecting portions 13. Namely, the contact portions 14 at the ends of the projecting portions 13 are caused to reciprocate to the utmost extent only in the X direction through vibrations in the mode B.

By combining vibrations in the modes A and B, the position of the anti-node of vibration in the mode A and the position of the nodal line of vibration in the mode B are made substantially coincident with each other. Thus, by providing the projecting portions 13 close to the position where they are coincident with each other, and close to the short sides S1 and S2 of the elastic body 11, high output is obtained. Moreover, because the contact portions 14 at the ends of the projecting portions 13 are greatly displaced in the Z direction and the X direction, the contact portions 14 apply great frictional driving force to the driven body 2 which is brought into pressure contact with the contact portions 14.

It should be noted that in the vibrating body described in Japanese Patent Publication No. 4261964, which is the background art described above, driving vibrations obtained by combining vibrations in the primary out-of-plane bending vibration mode and vibrations in the secondary out-of-plane bending vibration mode are excited. The primary out-of-plane bending vibrations are vibrations in which two nodal lines appear substantially parallel to a direction that connects the two projecting portions together. The secondary out-of-plane bending vibrations are vibrations in which three nodal lines appear substantially parallel to a direction perpendicular to both a direction that connects the two projecting portions together and a direction in which the projecting portions are projected. Vibrations in the mode A excited in the vibrating body 10 constituting the vibration-type actuator 1 are the same as the primary out-of-plane bending vibrations excited in the vibrating body described in Japanese Patent Publication No. 4261964.

Assume here that the vibrating body described in Japanese Patent Publication No. 4261964 and the vibrating body 10 constituting the vibration-type actuator 1 have an equivalent shape except for positions at which the projecting portions are provided. In this case, when the resonance frequency in the mode B for use in exciting the vibrating body 10 is 137 kHz, the resonance frequency in the secondary out-of-plane vibration mode for use in exciting the vibrating body described in Japanese Patent Publication No. 4261964 is 211 kHz. Thus, driving frequency fd of the vibrating body 10 is reduced as compared to the vibrating body described in Japanese Patent Publication No. 4261964, and hence a driving circuit for driving the vibration-type actuator 1 is configured at low cost.

Also, assume that for the vibrating body described in Japanese Patent Publication No. 4261964, the resonance frequency in the secondary out-of-plane vibration mode is approximated to the resonance frequency in the mode B in FIG. 2B and is also combined with the primary out-of-plane vibration mode, the need to increase the length of the long sides of the vibrating body by approximately 1.25 times arises. Namely, when the resonance frequencies are equal, the size of the vibrating body described in Japanese Patent Publication No. 4261964 is larger than that of the vibrating body 10 constituting the vibration-type actuator 1. In other words, the vibrating body 10 in which driving vibrations obtained by combining vibrations in the modes A and B in FIGS. 2A and 2B are excited can be downsized to a greater extent than the vibrating body described in Japanese Patent Publication No. 4261964. Furthermore, since the low-order bending vibration modes are used for the vibrating body 10, there are few other unwanted vibration modes in the vicinity of a higher resonance frequency fr of the resonance frequencies in the modes A and B, and therefore, the vibrating body 10 has an advantage that excitation of vibrations in the modes A and B is less likely to be hampered by unwanted vibrations.

It should be noted that the shape (the dimensional ratio among sides) of the vibrating body 10 and the difference $\Delta f$ in resonance frequency between the modes A and B may be any values as long as driving vibrations are excited by combining vibrations in the modes A and B, and they are not limited to any specific values because customization suited to required characteristics, purposes of use, installation spaces, and so forth is possible. Further, the shape of the vibrating body 10 may be asymmetric due to a dimensional deviation made in a machining step or an assembling step, and the vibrating body 10 may be asymmetrically installed due to misalignment of a supporting position and a peripheral component. In this case, mode shapes of the two bending vibration modes become unbalanced, and for example, one of the two nodal lines Y1 and Y2 in the modes A may cross a long side of the elastic body 11 and extend out from a projected plane of the plane of the elastic body 11.

Figure 5A:
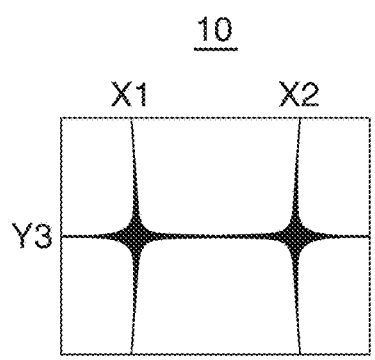
FIG. 5A is a view showing in schematic form nodal lines associated with vibration in the mode B when the vibrating body in FIGS. 1A and 1B has no assembly errors.
Figure 5B:
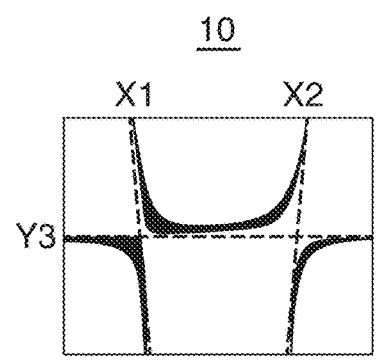
FIG. 5B is a view showing in schematic form the nodal lines associated with vibration in the mode B when the vibrating body in FIGS. 1A and 1B has assembly errors.

FIG. 5A is a view showing in schematic form the nodal lines of vibration in the mode B when the vibrating body 10 has no assembly error. FIG. 5B is a view showing in schematic form the nodal lines of vibration in the mode B when the vibrating body 10 has an assembly error. An ideal mode shape of the mode B shown in FIG. 5A may become a mode shape with its positions of nodal lines changed as indicated by solid lines (area filled in with black) in FIG. 5B due to an asymmetrical shape of the vibrating body 10. However, driving force can be applied from the contact portions 14 to the driven body 2 as long as a vibration displacement in a predetermined direction described above occurs at the locations where the projecting portions 13 are provided. In particular, even when the mode shape of the mode B is changed to have nodal lines as shown in FIG. 5B, the amplitude of vibration in close proximity to them is sufficiently smaller than at the anti-node of vibration, and hence regarding the mode B as a mode having nodes at positions indicated by broken lines in FIG. 5B will present substantially no problem. Namely, positions of nodes, which the two bending vibration modes have, have only to fall within a scope that does not depart from their main features and the technical idea of the present invention.

Figure 6:
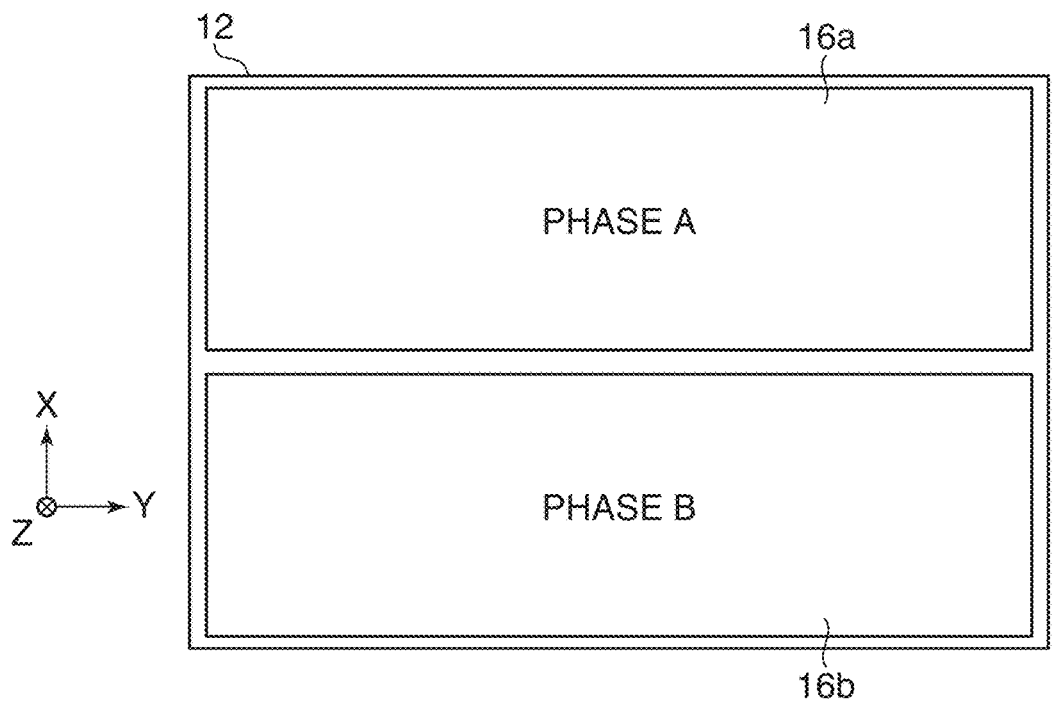
FIG. 6 is a view showing an electrode pattern of a piezoelectric element which constitutes the vibrating body in FIGS. 1A and 1B.

FIG. 6 is a view showing an electrode pattern of the piezoelectric element 12. The piezoelectric element 12 has a structure in which a phase-A electrode 16a and a phase-B electrode 16b shown in FIG. 6 are formed on a surface (a surface joined to the FPC 15) of rectangular flat-shaped piezoelectric ceramics, and a full-surface electrode, not shown, is formed on a rear surface (a surface joined to the elastic body 11) of the piezoelectric ceramics. The phase-A electrode 16a and the phase-B electrode 16b are formed in two split parts in the X direction with a boundary which is one nodal line Y3 substantially parallel to the Y direction of the mode B, and they are polarized in the same direction in the Z direction. An AC voltage V1 is applied from the FPC 15 to the phase-A electrode 16a, and an AC voltage V2 is applied from the FPC 15 to the phase-B electrode 16b. The full-surface electrode, not shown, is used as a ground electrode. It should be noted that conduction of electricity is obtained from the full-surface electrode, not shown, through a surface of the elastic body 11 because the full-surface electrode is in conduction with the elastic body 11 in a state in which the piezoelectric element 12 is bonded to the elastic body 11. Alternatively, conduction of electricity may be obtained from the full-surface electrode through a surface of the piezoelectric element 12 by providing the piezoelectric ceramics with a through hole or routing an electrode from a side face of the piezoelectric ceramics.

When the AC voltages V1 and V2 are input in the same phase to the phase-A electrode 16a and the phase-B electrode 16b in a case where the AC voltages V1 and V2 are the same in terms of voltage value and frequency, expansion and contraction occur in the same direction in the phase-A electrode 16a and the phase-B electrode 16b. Thus, by approximating frequencies of the AC voltages V1 and V2 to the resonance frequency of the mode A in which expansion and contraction occur in the same direction in the phase-A electrode 16a and the phase-B electrode 16b, vibrations in the mode A are excited in the vibrating body 10. On the other hand, when the AC voltages V1 and V2 are input in opposite phases to the phase-A electrode 16a and the phase-B electrode 16b in a case where the AC voltages V1 and V2 are the same in terms of voltage value and frequency, expansion and contraction occur in opposite directions in the phase-A electrode 16a and the phase-B electrode 16b. Thus, by approximating frequencies of the AC voltages V1 and V2 to the resonance frequency of the mode B in which expansion and contraction occur in opposite directions in the phase-A electrode 16a and the phase-B electrode 16b, vibrations in the mode B are excited in the vibrating body 10.

The vibrating body 10 is designed such that the respective resonance frequencies of the modes A and B are close to each other. The driving frequency fd is set to a value close to the respective resonance frequencies of the modes A and B. As a result, when the AC voltages V1 and V2 of the same voltage value are applied at the driving frequency fd to the phase-A electrode 16a and the phase-B electrode 16b, respectively, in phases staggered 90 degrees, vibrations in the respective modes A and B are excited in the vibrating body 10 in phases staggered 90 degrees. As a result, oval motions are generated within a ZX plane in the contact portions 14, which in turn apply frictional driving force to the driven body 2, causing the vibrating body 10 and the driven body 2 to move relatively to each other in the X direction.

It should be noted that in the present embodiment, the piezoelectric ceramics constituting the piezoelectric element 12 is polarized in the same direction in the areas where the phase-A electrode 16a and the phase-B electrode 16b are formed. However, the arrangement of the piezoelectric element 12 is not limited as long as vibrations in the modes A and B are excited in the vibrating body 10, and a pattern of electrodes formed on the piezoelectric ceramics and a direction of polarization are not limited to those described above with reference to FIG. 6.

Figure 7A:
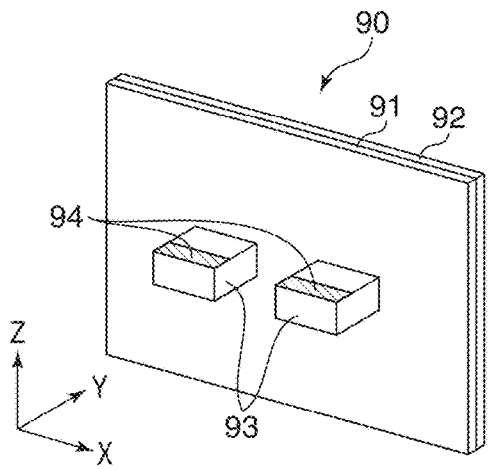
FIGS. 7A and 7C are perspective views schematically showing an arrangement of a vibrating body according to the prior art and an arrangement of the vibrating body in FIGS. 1A and 1B, respectively.
Figure 7B:
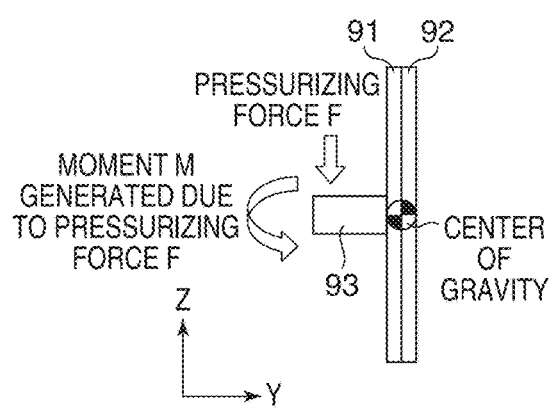
FIGS. 7B and 7D are views schematically showing how a pressurizing (or pressing) force acting from the driven body on the respective vibrating bodies has an influence on the positions of the vibrating bodies.
Figure 7C:
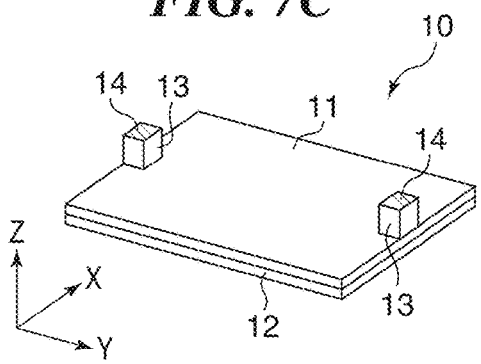
Figure 7D:
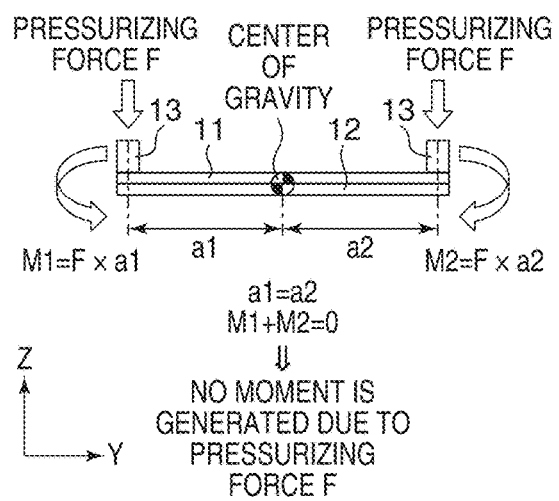

A description will now be given of characteristics of position holding of the vibrating body 10 in the vibration-type actuator 1. Here, the first vibrating body described in Japanese Patent Publication No. 3363510 mentioned in the above description of related art is taken as an example of prior arts and compared with the vibrating body 10. FIG. 7A is a perspective view schematically showing an arrangement of a vibrating body 90 according to the prior art (described in Japanese Patent Publication No. 3363510), and FIG. 7B is a view showing in schematic form how pressurizing force from a driven body, not shown, acting on the vibrating body 90 has an influence on the vibrating body 90. FIG. 7C is a perspective view schematically showing an arrangement of the vibrating body 10, and FIG. 7D is a view showing in schematic form how pressurizing force from a driven body, not shown, acting on the vibrating body 10 has an influence on the vibrating body 10. It should be noted that elements in FIG. 7C are the same as some of those in FIG. 1B, and hence description thereof is omitted.

The vibrating body 90 has a rectangular flat-shaped elastic body 91, a piezoelectric element 92 joined to one surface of the elastic body 91, and two prismatic projecting portions 93 provided on the other surface of the elastic body 91 with a predetermined space left therebetween in a longitudinal direction (X direction) of the elastic body 91. A driven body, not shown, is in pressure contact with ends 94 of surfaces of the projecting portions 93 which are perpendicular to a lateral direction (Z direction) of the elastic body 91, and by generating oval motions within a ZX plane in the ends 94, the driven body is driven in the X direction. At this time, pressurizing force F is applied from the driven body to a position deviated from the center of gravity of the vibrating body 90 as shown in FIG. 7B, and hence rotational moment M is generated when the ends 94 are subject to the pressurizing force F. As a result, the position of the vibrating body 90 is tilted, resulting in unevenness of the distribution of pressure applied to the ends 94 by the pressurizing force F, and therefore, the problem of increased losses in the transmission of frictional driving force to the driven body arises.

On the other hand, as shown in FIG. 7C, the projecting portions 13 of the vibrating body 10 are placed at such locations that that they are substantially rotationally symmetrical with respect to an axis in the Z direction passing through the center of gravity of the vibrating body 10. Also, the holes 17 for fixing the FPC 15 to the base 3 are formed at such locations that they are substantially rotationally symmetrical with respect to the axis in the Z direction passing through the center of gravity of the vibrating body 10. Thus, the vibrating body 10 is supported at the center of gravity by the FPC 15 from a direction paired with pressurizing force. Assume here that as shown in FIG. 7D, the two contact portions 14 lie at distances a1 and a2 from the center of gravity in the Y direction, and the pressurizing force F is applied to the contact portions 14. In this case, moment M1

(=F×a1) is generated in one of the two contact portions 14, and moment M2 (=F×a1) is generated in the other one.

However, since the two contact portions 14 are placed at such locations that the relationship "a1=a2" holds, the moment M1 and the moment M2 have the relationship "M2=−M1", and as a result, no moment is generated in the vibrating body 10. This indicates that the pressurizing force F on the contact portions 14 and the cross product of its positional vectors and the pressurizing force acting on the center of gravity of the vibrating body 10 and the cross product of its positional vectors correspond to each other. Namely, when the contact portions 14 are subject to pressurizing force from the driven body 2, no moment of force is generated about the center of gravity of the vibrating body 10, and hence the pressurizing force F matches counterforce generated in the supporting portions (the places fastened with the bolts 4) of the FPC 15 supported at the center of gravity by the base 3. Thus, the driving body 10 receives, at its contact portions 14, pressurizing force from the driven body 2 in a stable manner with its position being held.

Figure 8:
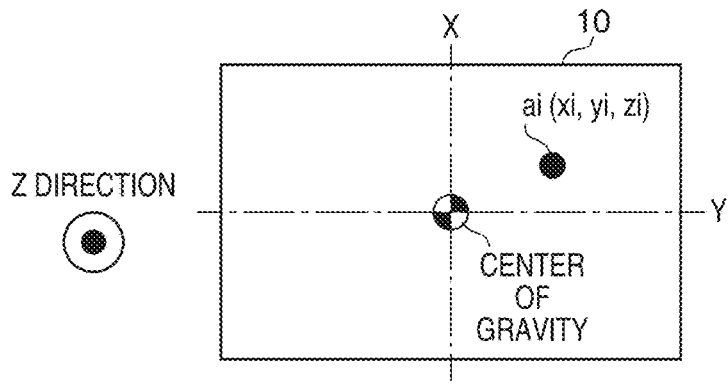
FIG. 8 is a view useful in explaining the relationship between positions of the contact portions and pressurizing force for stably holding the position of the vibrating body.

FIG. 8 is a view useful in explaining the relationship between the positions of the contact portions 14 and the pressurizing force F for stably holding the position of the vibrating body 10. Assume that the center of gravity of the vibrating body 10 is a point of origin (0, 0, 0), the vibrating body 10 is subject to the pressurizing force F=(0, 0, Fz) via the contact portions 14, and the vibrating body 10 is supported at the center of gravity from a direction paired with the pressurizing force F. In this state, at least one arbitrary point of contact $ai=(xi, yi, zi)$ ($i=1, 2, \ldots$) is provided in the vibrating body 10. Assuming that in the state where the pressurizing force F acts on the contact portions 14 is a state where the point of contact $ai$ is subject to pressurizing force $Fi$, and force is applied to the point of contact $ai$ only in the same direction as that of the pressurizing force F, equations (1) and (2) below hold. In this case, in order to counterbalance moment that is generated so as to hold the position of the vibrating body 10, an equation (3) below needs to hold. When a plane of $zi=z1$ ($i=1, 2, \ldots$) is considered for the position $zi$ of the point of contact $ai$ in the Z direction, the pressurizing force $Fi$ in the equation (3) has a component only in the Z direction. Thus, when a point of contact $ai'=(xi, yi)$ ($i=1, 2, \ldots$) is given, the equation (3) is more simply expressed by an equation (4) below.

$$Fi=(0,0,Fzi)(Fzi\geq 0, i=1,2,\ldots) \quad (1)$$

$$\Sigma Fzi = Fz > 0 \quad (2)$$

$$\Sigma Fzi \times ai = 0 \quad (3)$$

$$\Sigma Fzi \times ai' = 0 \quad (4)$$

Here, pressurizing force $Fzi$ is a scalar quantity and is a coefficient of a positional vector of the point of contact $ai'$. When there is one point of contact $ai'$, this point of contact $ai'$ has only to match the center of gravity of the vibrating body 10, and when there are two points of contact $ai'$, the center of gravity of the vibrating body 10 has only to be on a straight line that connects the two points of contact $ai'$ together. When there are three or more points of contact $ai'$, the point of origin (0, 0) which is the center of gravity has only to be inside an area enclosed by the three or more points of contact $ai'$.

Figure 9A:
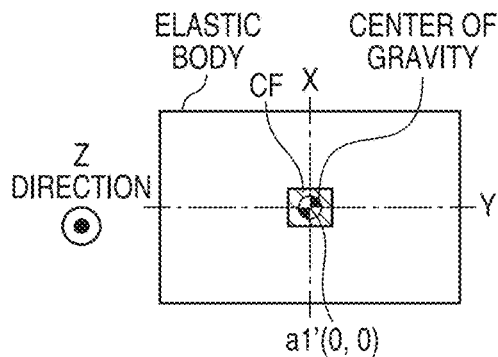
FIGS. 9A to 9C are views useful in explaining the placement of contact portions which satisfies conditions for stably holding the position of the vibrating body.
Figure 9B:
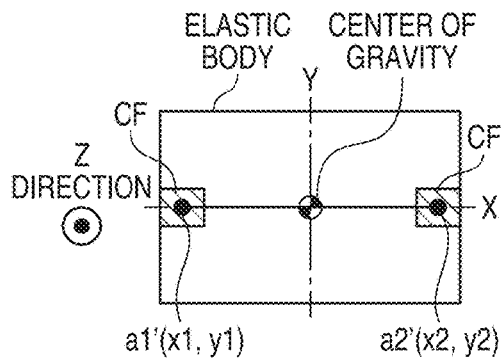
Figure 9C:
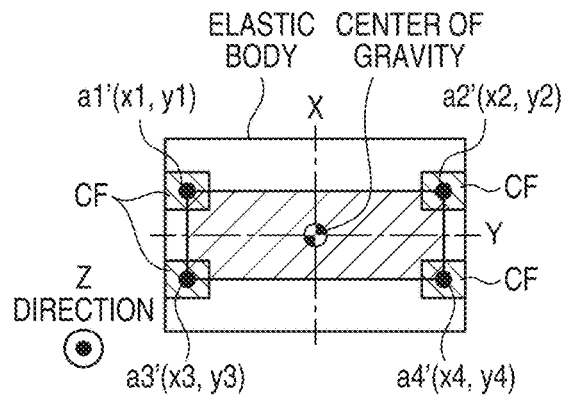

FIGS. 9A to 9C are views useful in explaining how points of contact are placed so as to satisfy conditions for stably holding the vibrating body when the number of points of contact CF is one, when the number of points of contact CF is two, and when the number of points of contact CF is four, which is an example in the case where the number of points of contact CF is three or more, respectively. It should be noted that when the number of points of contact CF is one, the point of contact CF is in a vibrating body 20, to be described later, when the number of points of contact CF is two, the point of contact CF is in the vibrating body 10 described above, and when the number of points of contact CF is four, the point of contact CF is in a vibrating body 30, to be described later. When the number of points of contact CF is one, the center of gravity has only to be inside the area of the point of contact CF. When the number of points of contact CF is two, the center of gravity has only to be present on a straight line that connects arbitrary points of contact $ai'$ $(xi, yi)$ ($i=1, 2$) inside areas of the points of contact CF to each other. When the number of points of contact CF is three or more, the center of gravity has only to be present inside an area enclosed by arbitrary points of contact $ai'$ $(xi, yi)$ ($i=1, 2, 3, \ldots$). When such conditions are satisfied, all the points of contact CF are kept in contact with the driven body at the same time while the position of the vibrating body does not substantially tilt even if the vibrating body is subject to the pressurizing force F when the operation of the vibration-type actuator is stopped.

It should be noted that in order to reduce variations in frictional driving force on a plurality of contacts $ai$ when driving vibrations are excited in the vibrating body, it is preferred that pressurizing forces $Fi$ received by the respective points of contact $ai$ are as equal as possible. Accordingly, it is preferred that the points of contact $ai$ are located at such positions as to be rotationally symmetrical with respect to an axis in the Z direction passing through the center of gravity of the vibrating body, and the vibration-type actuator 1 is designed such that the center of gravity of the two contact portions 14 of the vibrating body 10 correspond to the center of gravity of the vibrating body 10. This reduces unevenness of pressurization on the two contact portions 14 and reduces loss in the transmission of frictional driving force to the driven body 2. Variations in the position $zi$ in the Z direction caused by variations in assembly accuracy and dimensional tolerance reduce variations in pressurizing force generated at the point of contact $ai$ as long as the supporting portions fixing the FPC 15 to the base 3 are elastically deformable in the Z direction.

As described above, the vibration-type actuator 1 according to the present embodiment is able to lower the resonance frequencies of the two bending vibration modes in which driving vibrations are excited in the vibrating body 10 and enables downsizing without increasing the resonance frequencies. In addition to such effects, the vibration-type actuator 1 has the effect of stably holding the position of the vibrating body 10 against pressurizing force from the driven body 2. Accordingly, stable driving characteristics are obtained, and high driving performance is also obtained.

Second Embodiment

Figure 10A:
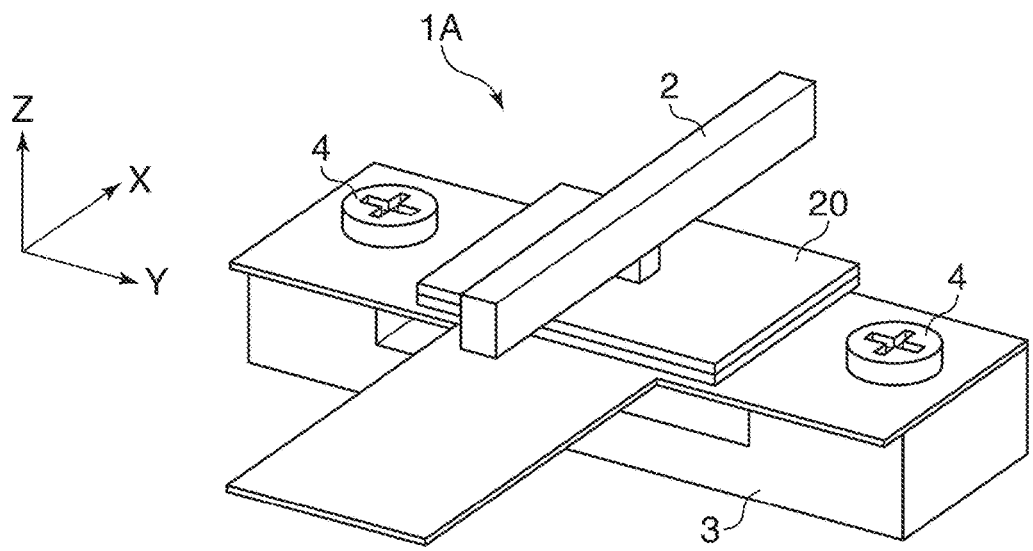
FIG. 10A is a perspective view schematically showing an arrangement of a vibration-type actuator according to a second embodiment of the present invention.
Figure 10B:
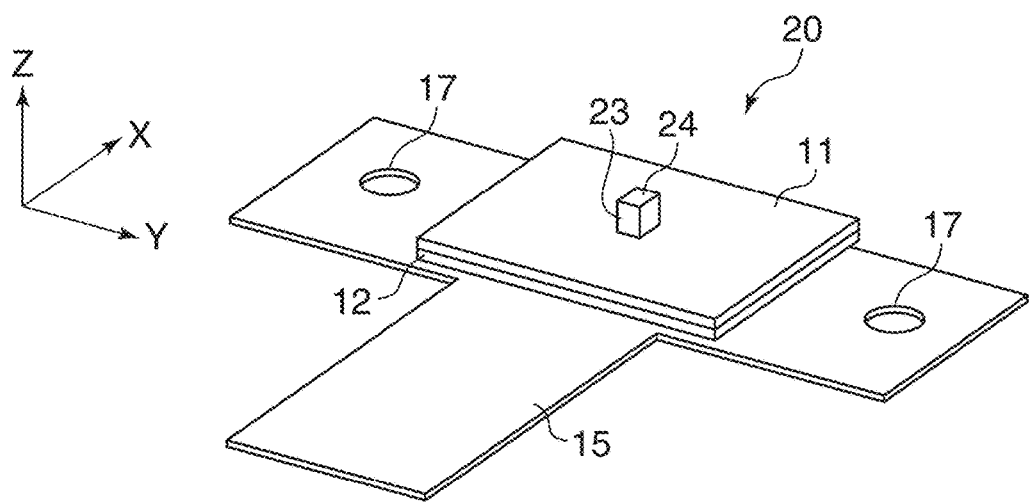
FIG. 10B is an appearance perspective view showing a vibrating body, which constitutes the vibration-type actuator, and its surrounding arrangement.

A description will now be given of a second embodiment of the present invention. FIG. 10A is a perspective view schematically showing an arrangement of a vibration-type actuator 1A according to the second embodiment of the present invention. FIG. 10B is an appearance perspective view showing the vibrating body 20, which constitutes the vibration-type actuator 1A, and its surrounding arrangement. It should be noted that component elements of the vibration-type actuator 1A which are the same as those of the vibration-type actuator 1 of the first embodiment described above are designated by the same names and the same reference symbols, and duplicate description thereof is omitted here.

The vibration-type actuator 1A has the vibrating body 20 and the driven body 2. The vibrating body 20 has the elastic body 11, the piezoelectric element 12, and one projecting portion 23. An end of the projecting portion 23 is a contact portion 24 that is brought into pressure contact with the driven body 2. The vibrating body 20 is held on the base 3 via the FPC 15. The projecting portion 23 is provided at a central part of the elastic body 11 (close to the nodal line Y3 of the mode B and midway between the nodal lines X1 and X2 of the mode B (close to the midsection in the Y direction)). The projecting portion 23 is equivalent to the projecting portions 13, and the contact portion 24 is equivalent to the contact portions 14.

In the vibration-type actuator 1A, only the contact portion 24 at the end of the projecting portion 23 applies frictional driving force to the driven body 2. This eliminates loss in sliding on the driven body 2 arising from variations in oval motions of contact portions which may occur in a vibrating body having a plurality of projecting portions. Moreover, because the two projecting portions 13 are not placed with a space left therebetween like the vibrating body 10, the driven body 2 is allowed to be downsized. As a result, the vibration-type actuator 1A is downsized as a whole, and a space for installation of the vibration-type actuator 1A is saved.

Two bending vibration modes for exciting driving vibrations in the vibrating body 20 are the modes A and B of the first embodiment described above, and hence description thereof is omitted here. The way of applying AC voltage to the piezoelectric element 12 and the relationship between the contact portion 24 and pressurizing force acting on it are also the same as those of the first embodiment described above, and hence description thereof is omitted here.

Figure 11A:
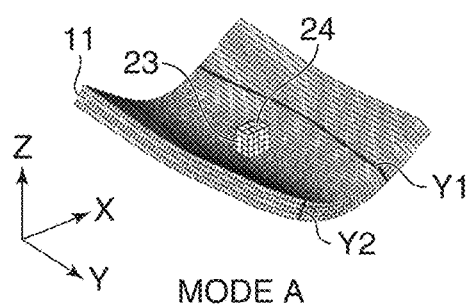
FIGS. 11A and 11B are perspective views useful in explaining two bending vibration modes (modes A and B) in which vibrations are excited in the vibrating body in FIGS. 10A and 10B.
Figure 11B:
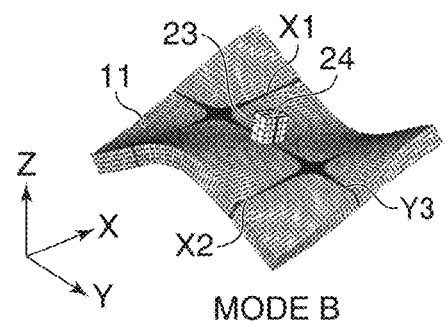
Figure 12A:
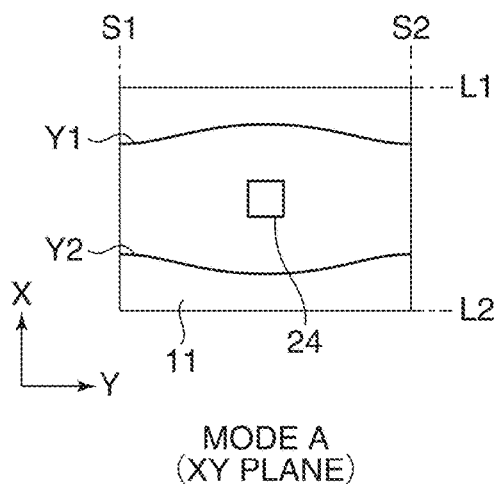
FIGS. 12A and 12B are views useful in explaining how a projecting portion and a contact portion move as the vibrating body in FIGS. 10A and 10B is deformed through vibrations in the mode A.
Figure 12B:
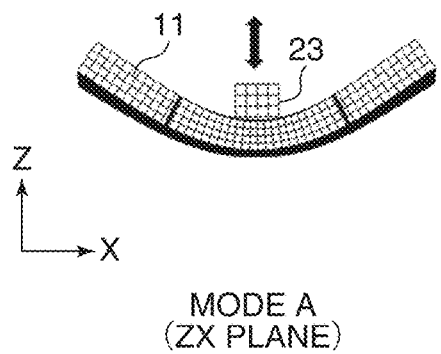
Figure 13A:
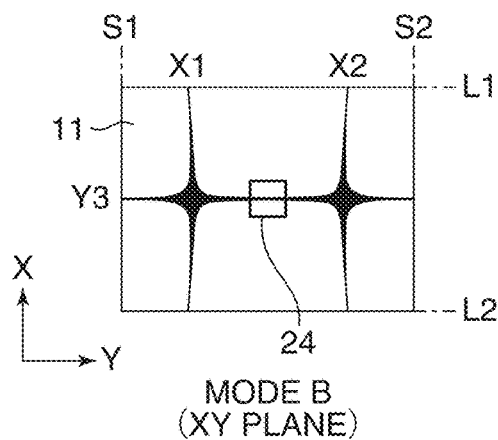
FIGS. 13A and 13B are views useful in explaining how the projecting portion and the contact portion move as the vibrating body in FIGS. 10A and 10B is deformed through vibrations in the mode B.
Figure 13B:
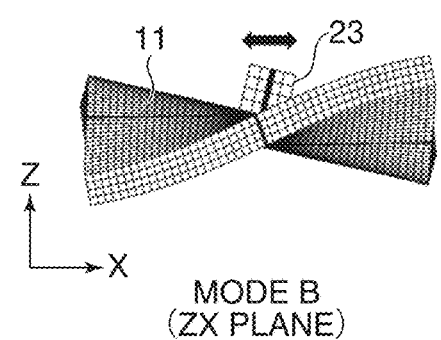

A description will now be given of the relationship between the modes A and B and the projecting portion 23 (the contact portion 24). FIGS. 11A and 11B are perspective views useful in explaining the two bending vibration modes in which vibrations are excited in the vibrating body 20. FIG. 11A shows in schematic form how the vibrating body 20 is deformed in the mode A, and FIG. 11B shows in schematic form how the vibrating body 20 is deformed in the mode B. FIGS. 12A and 12B are views useful in explaining how the projecting portion 23 and the contact portion 24 move as the vibrating body 20 is deformed through vibrations in the mode A, FIG. 12A showing a state as seen from the Z direction, and FIG. 12B showing a state as seen from the Y direction. FIGS. 13A and 13B are views useful in explaining how the projection 23 and the contact portion 24 move as the vibrating body 20 is deformed through vibrations in the mode B, FIG. 13A showing a state as seen from the Z direction, and FIG. 13B showing a state as seen from the Y direction.

The projecting portion 23 is placed close to an anti-node of vibration in the mode A, close to the nodal line Y3 substantially parallel to the Y direction of vibration in the mode B, and in an area between the two nodal lines X1 and X2 substantially parallel to the Y direction of vibration in the mode B. By placing the projecting portion 23 at the anti-node of vibration in the mode A, the contact portion 24 is caused to reciprocate to a large extent in the Z direction without having vibration displacement components in unwanted directions. Vibrations in the mode B have no vibration displacement components in unwanted directions other than the Z direction, the contact portion 24 is caused to reciprocate only in the Z direction. Particularly, it is preferred that in the Y direction, the projecting portion 23 is placed midway between the two nodal lines X1 and X2 substantially parallel to the X direction, and this enables vibrations in the mode B to maximize reciprocation of the contact portion 24 in the X direction.

Namely, placing the projecting portion 23 as described above enables vibrations in the mode A to maximize reciprocating vibrations in the Z direction and also enables vibrations in the mode B to maximize reciprocating vibrations in the X direction, and therefore, great frictional driving force is generated. Moreover, since the projecting portion 23 is placed in the central part of the elastic body 11, rotational moment as in the first embodiment described above with reference to FIGS. 7A and 7B is not generated in the vibrating body 20 due to pressurizing force from the driven body 2. Therefore, the arrangement for supporting the vibrating body 10 of the first embodiment described above is allowed to be applied to the vibrating body 20, and this enables the vibrating body 20 to stably receive pressurizing force from the driven body 2 without tilting its position. As a result, stable driving characteristics are obtained. As described above, in the present embodiment, it is possible to downsize the vibration-type actuator. Moreover, according to the present embodiment, since the position of the vibrating body is stably held, stable driving characteristics are obtained, and high driving performance is obtained.

Third Embodiment

Figure 14A:
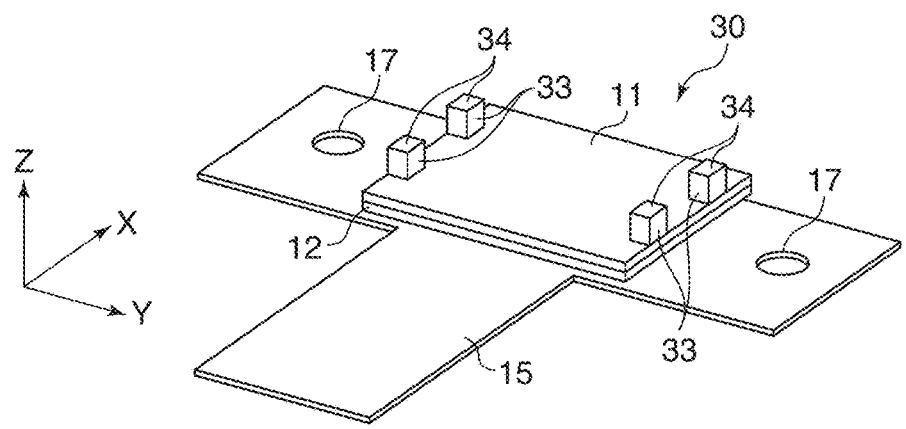
FIG. 14A is a perspective view schematically showing an arrangement of a vibrating body which constitutes a vibration-type actuator according to a third embodiment of the present invention.

A description will now be given of a third embodiment of the present invention. FIG. 14A is a perspective view schematically showing an arrangement of the vibrating body 30, which constitutes a vibration-type actuator according to the third embodiment of the present invention. The vibrating body 30 has the elastic body 11, the piezoelectric element 12, and four projecting portions 33. Ends of the respective projecting portions 33 are contact portions 34 that are brought into pressure contact with a driven body, not shown. The vibrating body 30 is held on the base 3 via the FPC 15. The vibrating body 30 differs from the vibrating body 10 (first embodiment), in which one projecting portion 13 is provided at each end of the elastic body 11 in the Y direction, in that two projecting portions 23 are provided at each end of the elastic body 11 in the Y direction. It should be noted that component elements of the vibrating body 30 which are the same as those of the vibrating body 10 according to the first embodiment described above are designated by the same names and the same reference symbols, and duplicate description thereof is omitted here. The projecting portions 33 are equivalent to the projecting portions 13, and the contact portions 34 are equivalent to the contact portions 14.

In the vibrating body 10 of the first embodiment described above, reciprocating motions of the contact portions 14 in the Z direction are caused by vibrations in the mode A, and reciprocating motions of the contact portions 14 in the X direction are caused by vibrations in the mode B. On the other hand, in the vibrating body 30, reciprocating motions in the X direction are caused by vibrations in the mode A, and reciprocating motions in the Z direction are caused by vibrations in the mode B. This obtains the same effects as those in the first embodiment. Moreover, the area of contact between the driven body and the vibrating body 30 is increased, and hence when pressurizing force from the same driven body acts on each of the vibrating body 10 and the vibrating body 30, surface pressure received by the contact portions 34 is lower than surface pressure received by the contact portions 14. This reduces the amount of wear of the contact portions 34 and increases the durability of the vibration-type actuator. In addition, since the vibrating body 30 has more areas of contact with the driven body than the vibrating body 10, the position of the vibrating body 30 is made more stable to reduce unevenness of pressurizing force received by the contact portions 34, and this reduces loss in the transmission of frictional driving force to the driven body.

Two bending vibration modes for exciting driving vibrations in the vibrating body 30 are the modes A and B of the first embodiment described above, and hence description thereof is omitted here. The way of applying AC voltage to the piezoelectric element 12 and the relationship between the contact portions 34 and pressurizing force acting on it are also the same as those of the first embodiment described above, and hence description thereof is omitted here.

A description will now be given of vibrations in the modes A and B and movement of the projecting portions 33 (the contact portions 34). The projecting portions 33 are placed close to the two nodal lines Y1 and Y2 of vibration in the mode A, close to an anti-node of vibration away from the nodal line Y3 of vibration in the mode B, and close to the short sides of the elastic body 11 near the nodal lines X1 and X2 of vibration in the mode B. This enables the projecting portions 33 to reciprocate to a large extent in the X direction without having vibration displacement components in unwanted directions.

Figure 14B:
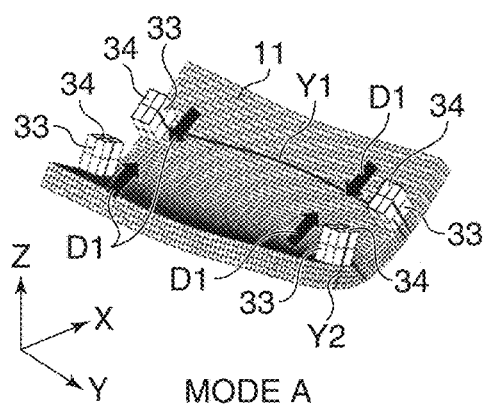
FIGS. 14B and 14C are perspective views useful in explaining how projecting portions move in respective two bending vibration modes in which vibrations are excited in the vibrating body.

FIG. 14B is a view useful in explaining how the projecting portions 33 move as the vibrating body 30 is deformed through vibrations in the mode A excited in the vibrating body 30. In FIG. 14B, arrows D1 indicate directions of motion at a certain moment in a reciprocating motion in the X direction generated in the projecting portions 33 when a vibration in the mode A is excited. As is apparent from FIG. 14B, two of the four projecting portions 33, which face each other in the X direction of the elastic body 11, are displaced in opposite directions (their reciprocating motions are in opposite phases) in the X direction. Also, as is apparent from FIG. 14B, two of the four projecting portions 33, which face each other in the Y direction of the elastic body 11, are displaced in the same direction (their reciprocating motions are in the same phase) in the X direction.

Figure 14C:
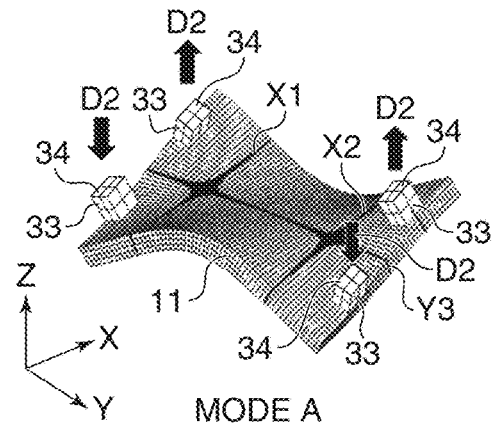

FIG. 14C is a view useful in explaining how the projecting portions 33 move as the elastic body 11 is deformed through vibrations in the mode B excited in the vibrating body 30. In FIG. 14C, arrows D2 indicate directions of motion at a certain moment in a reciprocating motion in the Z direction generated in the projecting portions 33 when a vibration in the mode B is excited. As is apparent from FIG. 14C, two of the four projecting portions 33, which face each other in the X direction of the elastic body 11, are displaced in opposite directions (their reciprocating motions are in opposite phases) in the Z direction as with the mode A described above. Also, as is apparent from FIG. 14C, two of the four projecting portions 33, which face each other in the Y direction of the elastic body 11, are displaced in the same direction (their reciprocating motions are in the same phase) in the Z direction.

As a result, by exciting vibrations in the modes A and B in phases staggered 90 degrees, oval motions to drive the driven body in the same direction is generated in all the contact portions 34. At this time, in the vibrating body 30, oval motions generated in the two projecting portions 33 facing each other in the X direction are in opposite phases, and hence the two pairs of contact portions 34 facing each other in the Y direction alternately come into contact with the driven body.

A vibration-type actuator having the vibrating body 30 reduces loss in the transmission of frictional driving force arising from unevenness of pressurizing force on the four contact portions 34 and improves the durability of the vibrating body 30. Moreover, since the four contact portions 34 are placed symmetrically with respect to the X direction and the Y direction of the elastic body 11, rotational moment as in the first embodiment described above with reference to FIGS. 7A and 7B is not generated in the vibrating body 30 due to pressurizing force from the driven body. Therefore, the arrangement for supporting the vibrating body 10 of the first embodiment described above is allowed to be applied to the vibrating body 30, and this enables the vibrating body 30 to stably receive pressurizing force from the driven body without tilting its position. As a result, stable driving characteristics are obtained. As described above, in the present embodiment, it is possible to downsize the vibration-type actuator. Moreover, according to the present embodiment, since the position of the vibrating body is stably held, stable driving characteristics are obtained, and high driving performance is obtained.

Fourth Embodiment

Figure 15A:
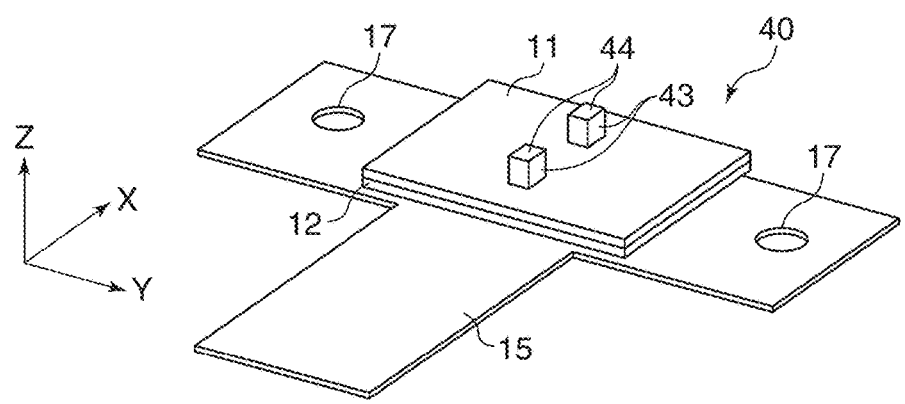
FIG. 15A is a perspective view schematically showing an arrangement of a vibrating body which constitutes a vibration-type actuator according to a fourth embodiment of the present invention.

A description will now be given of a fourth embodiment of the present invention. FIG. 15A is a perspective view schematically showing an arrangement of a vibrating body 40, which constitutes a vibration-type actuator according to the fourth embodiment of the present invention. The vibrating body 40 has the elastic body 11, the piezoelectric element 12, and two projecting portions 43. Ends of the respective projecting portions 43 are contact portions 44 that are brought into pressure contact with a driven body, not shown. The vibrating body 40 is held on the base 3 via the FPC 15. The vibrating body 40 differs from the vibrating body 20 (second embodiment), in which one projecting portion 23 is provided in substantially the center of the elastic body 11, in that the two projecting portions 43 are provided midway between the nodal lines X1 and X2 of the mode B and close to the nodal lines Y1 and Y2 of the mode A. It should be noted that component elements of the vibrating body 40 which are the same as those of the vibrating body 10 according to the first embodiment described above are designated by the same names and the same reference symbols, and duplicate description thereof is omitted here. The projecting portions 43 are equivalent to the projecting portions 13, and the contact portions 44 are equivalent to the contact portions 14.

In the vibrating body 20 of the second embodiment described above, reciprocating motions of the contact portions 24 in the Z direction caused by vibrations in the mode A, and reciprocating motions of the contact portions 24 in the X direction caused by vibrations in the mode B. On the other hand, in the vibrating body 40, as with the vibrating body 30 of the third embodiment described above, reciprocating motions in the X direction caused by vibrations in the mode A, and reciprocating motions in the Z direction caused by vibrations in the mode B. This obtains the same effects as those in the second embodiment. Moreover, when pressurizing force from the same driven body acts on each of the vibrating body 20 and the vibrating body 40, surface pressure received by the contact portions 44 is lower than surface pressure received by the contact portions 24 because the area of contact with the driven body is larger in the vibrating body 40 than in the vibrating body 20. This reduces the amount of wear of the contact portions 44 and improves the durability of the vibration-type actuator. In addition, since the vibrating body 40 has a larger area of contact with the driven body than the vibrating body 20, the position of the vibrating body 40 is made more stable to reduce unevenness of pressurizing force received by the contact portions 44, and this reduces loss in transmission of frictional driving force to the driven body.

Two bending vibration modes for exciting driving vibrations in the vibrating body 40 are the modes A and B of the first embodiment described above, and hence description thereof is omitted here. The way of applying AC voltage to the piezoelectric element 12 and the relationship between the contact portions 44 and pressurizing force acting on it are also the same as those of the first embodiment described above, and hence description thereof is omitted here.

A description will now be given of vibrations in the modes A and B and movement of the projecting portions 43 (the contact portions 44). The projecting portions 43 are placed close to the two nodal lines Y1 and Y2 of vibration in the mode A, close to an anti-node of vibration away from the nodal line Y3 of vibration in the mode B, and substantially midway between the nodal lines X1 and X2 of vibration in the mode B. This enables the projecting portions 33 to reciprocate to a large extent in the X direction without having vibration displacement components in unwanted directions.

Figure 15B:
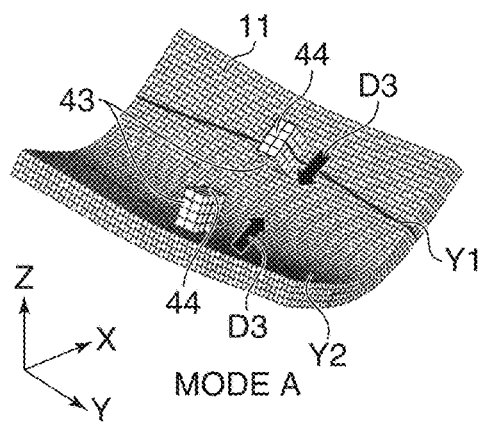
FIGS. 15B and 15C are perspective views useful in explaining how projecting portions move in respective two bending vibration modes in which vibrations are excited in the vibrating body.
Figure 15C:
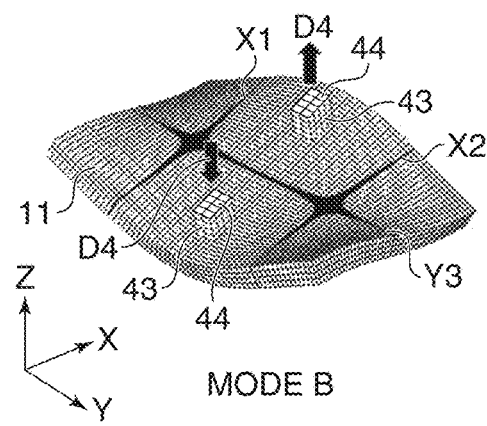

FIG. 15B is a view useful in explaining how the projecting portions 43 move as the elastic body 11 is deformed through vibrations in the mode A excited in the vibrating body 40. In FIG. 15B, arrows D3 indicate directions of movement at a certain moment in a reciprocating motion in the X direction generated in the projecting portions 43 when a vibration in the mode A is excited, and as is apparent from FIG. 15B, the two projecting portions 43 are displaced in opposite directions in the X direction. FIG. 15C is a view useful in explaining how the projecting portions 43 move as the elastic body 11 is deformed through vibrations in the mode B excited in the vibrating body 40. In FIG. 15C, arrows D4 indicate directions of motion at a certain moment in a reciprocating motion in the Z direction generated in the projecting portions 43 when a vibration in the mode B is excited, and as is apparent from FIG. 15C, the two projecting portions 43 are displaced in opposite directions in the Z direction. As a result, by exciting vibrations in the modes A and B in phases staggered 90 degrees, oval motions to drive the driven body in the same direction is generated in the two contact portions 44. The two projecting portions 43 alterably come into contact with the driven body to drive the driven body in the X direction because in the two projecting portions 43, oval motions are generated in opposite phases.

In the vibrating body 40, since the two contact portions 44 are placed symmetrically with respect to the X direction and the Y direction of the elastic body 11, rotational moment as in the first embodiment described above with reference to FIGS. 7A and 7B is not generated in the vibrating body 40 due to pressurizing force from the driven body. Therefore, the arrangement for supporting the vibrating body 10 of the first embodiment described above is allowed to be applied to the vibrating body 40, and this enables the vibrating body 40 to stably receive pressurizing force from the driven body without tilting its position. As a result, stable driving characteristics are obtained. As described above, in the present embodiment, it is possible to downsize the vibration-type actuator. Moreover, according to the present embodiment, since the position of the vibrating body is stably held, stable driving characteristics are obtained, and high driving performance is obtained.

Fifth Embodiment

Figure 16:
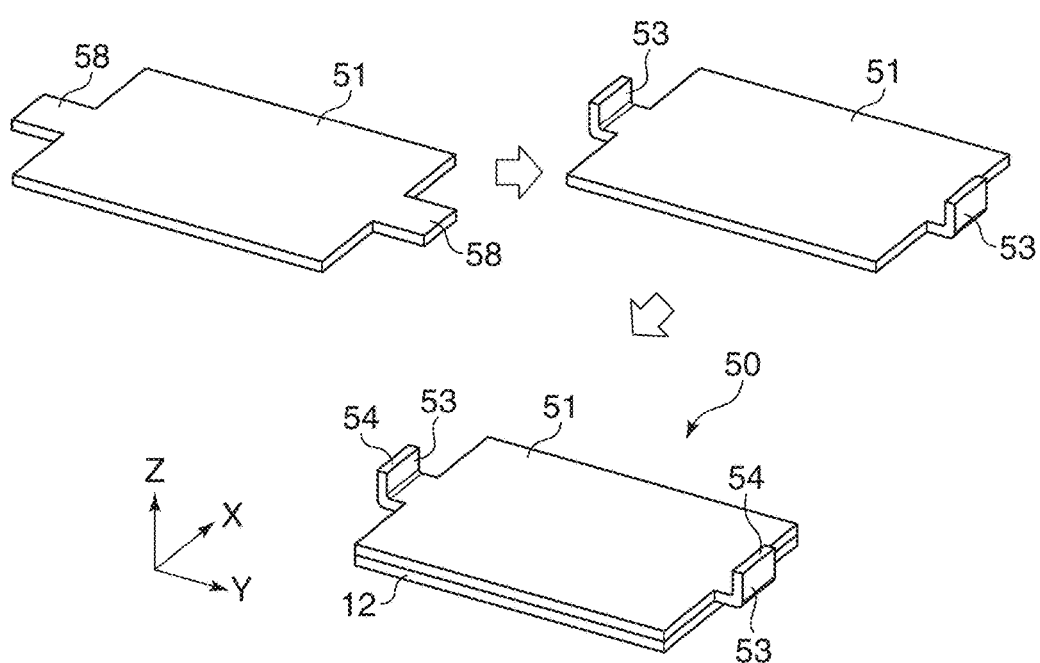
FIG. 16 is a view showing in simplified form a manufacturing process for a vibrating body which constitutes a vibration-type actuator according to a fifth embodiment of the present invention.

A description will now be given of a fifth embodiment of the present invention. FIG. 16 is a view showing in simplified form a manufacturing process for a vibrating body 50 which constitutes a vibration-type actuator according to the fifth embodiment of the present invention. The vibrating body 50 has an elastic body 51, two projecting portions 53 provided at ends of the elastic body 51 in the Y direction, and the piezoelectric element 12 joined to the elastic body 51. Ends of the respective projecting portions 53 are contact portions 54. The piezoelectric element 12 is the same as the piezoelectric element 12 of the first embodiment described above.

A brief explanation will now be given of the manufacturing process for the vibrating body 50. First, the elastic body 51, which is flat-shaped and has projecting portions 58 projecting in the Y direction, is prepared. It should be noted that the elastic body 51 with which the projecting portions 58 are integrally formed is fabricated by, for example, cutting using a wire or punching using a die, but the method of fabrication is not limited. Next, the projecting portions 58 are projected in the Z direction by bending to form the projecting portions 53. The elastic body 51 with the projecting portions 53 formed is subjected to thermal treatment or the like so as to increase hardness, and then the ends of the projecting portions 53 are subjected to grinding. As a result, the contact portions 54 with high abrasion resistance and a desired friction coefficient are formed at the ends of the projecting portions 53. Then, by joining the piezoelectric element 12 to a surface of the elastic body 51 opposing to a surface from which the projecting portions 53 are projected, the vibrating body 50 is fabricated.

In the vibrating body 50 thus fabricated, the piezoelectric element 12 and the two projecting portions 53 do not overlap as viewed in the Z direction, and hence the two projecting portions 53 are elastically deformable in the direction in which the piezoelectric element 12 is joined to the elastic body 51, that is, the Z direction in which pressurizing force from the driven body acts. By thus providing the projecting portions 53 with spring properties, the contact portions 54 are stably in pressure contact with the driven body, and as a result, stable driving characteristics are obtained.

For example, in the vibrating body 10 of the first embodiment described above, to form the projecting portions 13, which are elastically deformable in the Z direction of the elastic body 11, integrally with the elastic body 11, they may be formed as bosses by drawing or the like. In this case, however, a problem arises because machining becomes more difficult as the vibrating body 10 is downsized. On the other hand, the vibrating body 50 has an advantage that the projecting portions 53 are easily formed by bending even when the vibrating body 50 is downsized. Moreover, as compared to, for example, a case where projecting portions are joined to an elastic body by welding or the like, assembly steps and parts count for the vibrating body 50 are reduced because the projecting portions 53 are easily formed in the elastic body 51 by bending. Further, the vibrating body 50 has an advantage that the contact portions 54 with desired characteristics are easily formed by thermally treating the elastic body 51 with the projecting portions 53 formed and then grinding the projecting portions 53 without using frictional materials.

Two bending vibration modes for exciting driving vibrations in the vibrating body 50 are the modes A and B of the first embodiment described above, and hence description thereof is omitted here. The way of applying AC voltage to the piezoelectric element 12 and the relationship between the contact portion 54 and pressurizing force acting on it are also the same as those of the first embodiment described above, and hence description thereof is omitted here.

The vibrating body 50 is considered to be a form obtained by changing the projecting portions 13 of the vibrating body 10 of the first embodiment described above to the projecting portions 53 that are allowed to be formed integrally with the elastic body 11 by bending. Therefore, it goes without saying that the vibrating body 30 of the third embodiment described above as well may be changed to a form obtained by changing the four projecting portions 33 to projecting portions that are allowed to be formed integrally with the elastic body 11 by bending.

Figure 17A:
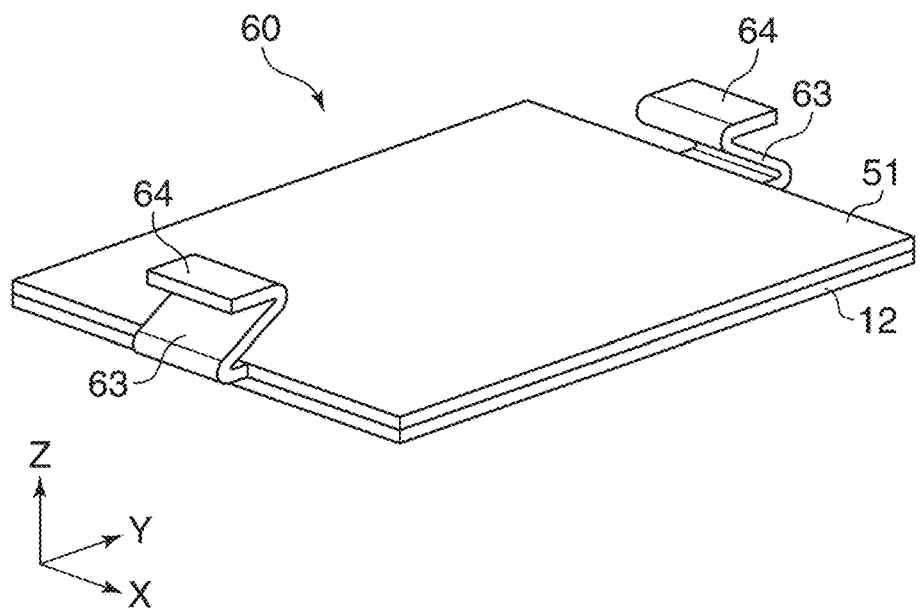
FIGS. 17A and 17B are perspective views schematically showing an arrangement of a first variation and a second variation, respectively, of the vibrating body in FIG. 16.
Figure 17B:
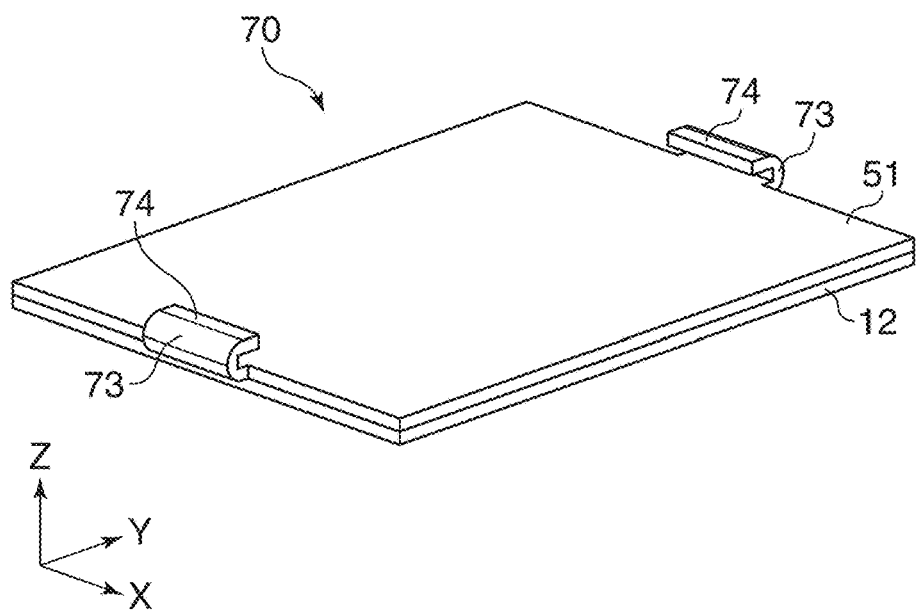

A form of projecting portions that are allowed to be formed integrally with an elastic body by bending is not limited to a bent form like the projecting portions 53 bent so as to be parallel to the Z direction of the elastic body 51. FIG. 17A is a perspective view schematically showing an arrangement of a vibrating body 60 according to a first variation of the vibrating body 50, and FIG. 17B is a perspective view schematically showing an arrangement of a vibrating body 70 according to a second variation of the vibrating body 50. Component elements of the vibrating bodies 60 and 70 which are the same as those of the vibrating body 50 are designated by the same names and the same reference symbols, and duplicate description thereof is omitted here.

The vibrating body 60 is formed integrally with the elastic body 51 and has projecting portions 63 which are substantially Z-shaped as seen from the X direction. Upper end surfaces (surfaces substantially perpendicular to the Z direction) of the projecting portions 63 are contact portions 64 that are brought into contact with a driven body. The vibrating body 70 is formed integrally with the elastic body 51 and has projecting portions 73 which are substantially C-shaped as seen from the X direction. Upper end surfaces of the projecting portions 73 are contact portions 74 that are brought into contact with a driven body. The projecting portions 63 and 73 are formed such that at least a part thereof does not overlap the piezoelectric element 12 as seen from the Z direction. The projecting portions 63 and 73 have characteristics that the spring property in the Z direction in which pressurizing force from the driven body acts is easily adjustable, and the area of contact with the driven body is easily adjustable as well. For this reason, stable driving characteristics for the driven body are obtained, and durability is improved.

Figure 18A:
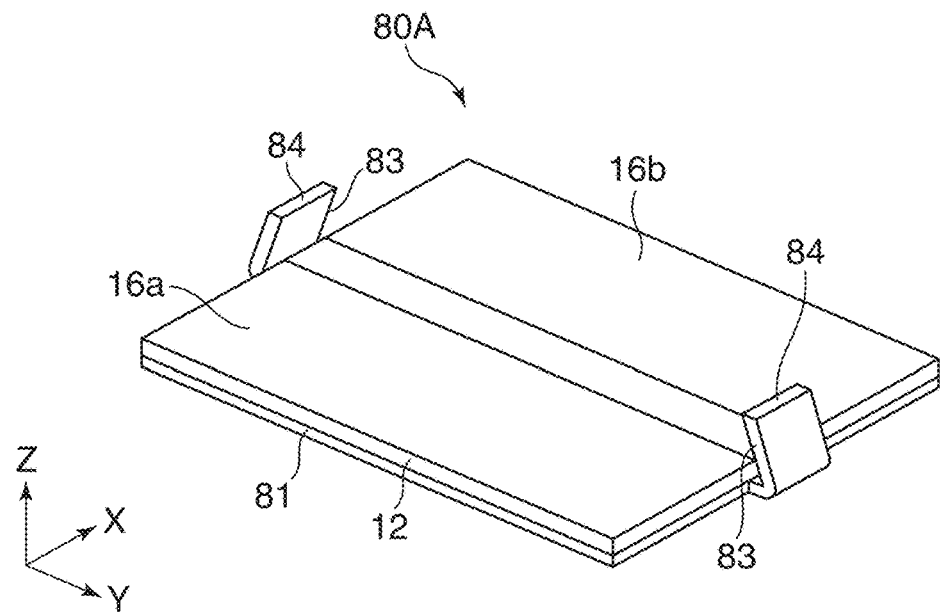
FIGS. 18A and 18B are perspective views schematically showing an arrangement of a third variation and a fourth variation, respectively, of the vibrating body in FIG. 16.

FIG. 18A is a perspective view schematically showing an arrangement of a vibrating body 80A according to a third variation of the vibrating body 50. The vibrating body 80A has an elastic body 81, in which projecting portions 83 are formed by bending projecting portions, and upper end faces of the projecting portions 83 are contact portions 84 that are brought into contact with a driven body as with the elastic body 51 (see FIG. 16) in which the projecting portions 53 are formed by bending the projecting portions 58. In the vibrating body 80A, the piezoelectric element 12 is joined onto a surface of the elastic body 81 from which the projecting portions 83 are projected. The vibrating body 80A as well obtains the same effects as those obtained by the vibrating body 50 and further saves space as compared to the vibrating body 50 because the piezoelectric element 12 is provided on the projecting portion 83 side of the elastic body 81.

Figure 18B:
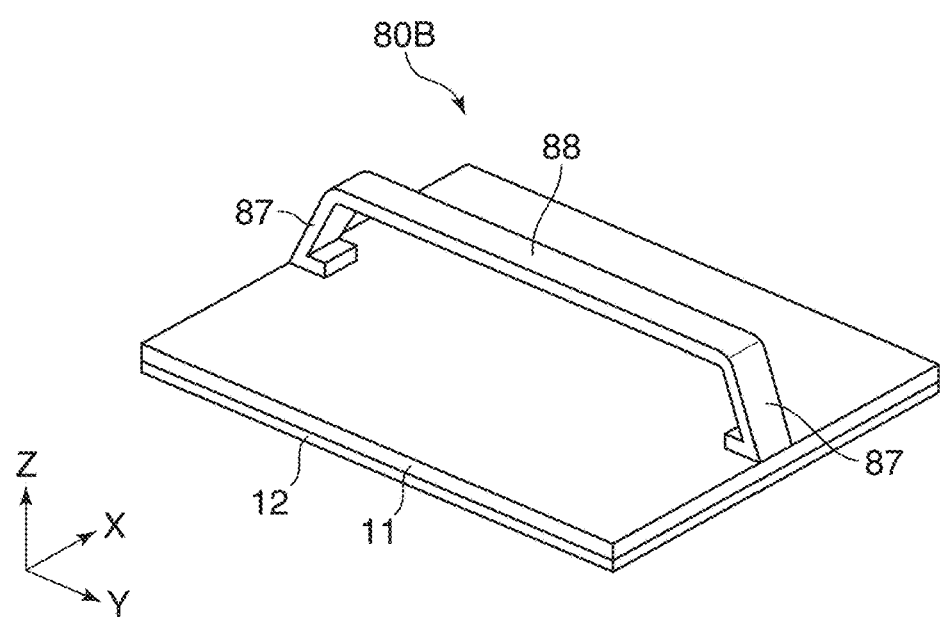

FIG. 18B is a perspective view schematically showing an arrangement of a vibrating body 80B according to a fourth variation of the vibrating body 50. The vibrating body 80B has the elastic body 11, the piezoelectric element 12, and a member that is comprised of two projecting portions 87 and one contact portion 88, which are formed integrally with each other by bending or the like. This member is welded on a surface of the elastic body 11. In the vibrating body 80B, when vibrations in the two bending vibration modes consisting of the modes A and B are excited in the elastic body 11, vibration displacements occurring in the two projecting portions 87 are the same, and hence a stable oval motion is generated in the contact portion 88. At this time, the area of contact between a driven body and the contact portion 88 is satisfactorily large, and this reduces surface pressure on the contact portion 88 and improves durability. Moreover, for the two projecting portions 87, it is possible to set a desired spring constant in a pressurizing direction using shapes. Furthermore, by reducing the width of the contact portion 88 in the driving direction (the X direction), surface pressure is maintained against a predetermined pressurizing force on the driven body, and also variations in oval motions in the driving direction are reduced. This reduces loss in the transmission of frictional driving force and obtains stable driving characteristics.

In any of the embodiments described above, projecting portions provided in an elastic body is given a desired spring constant for pressurizing force by increasing the amplitude of vibration in contact portions in the driving direction and adding a twist to their shape. Contact portions are intended to transmit driving force to a driven body, and the placement thereof determines a position of a vibrating body against pressurizing force. For this reason, shapes of projecting portions and contact portions are allowed to be set as appropriate based on the matters described above so that desired characteristics can be obtained. As described above, in the present embodiment, it is possible to downsize the vibration-type actuator. Moreover, according to the present embodiment, since the position of the vibrating body is stably held, stable driving characteristics are obtained, and high driving performance is obtained.

Sixth Embodiment

Figure 19:
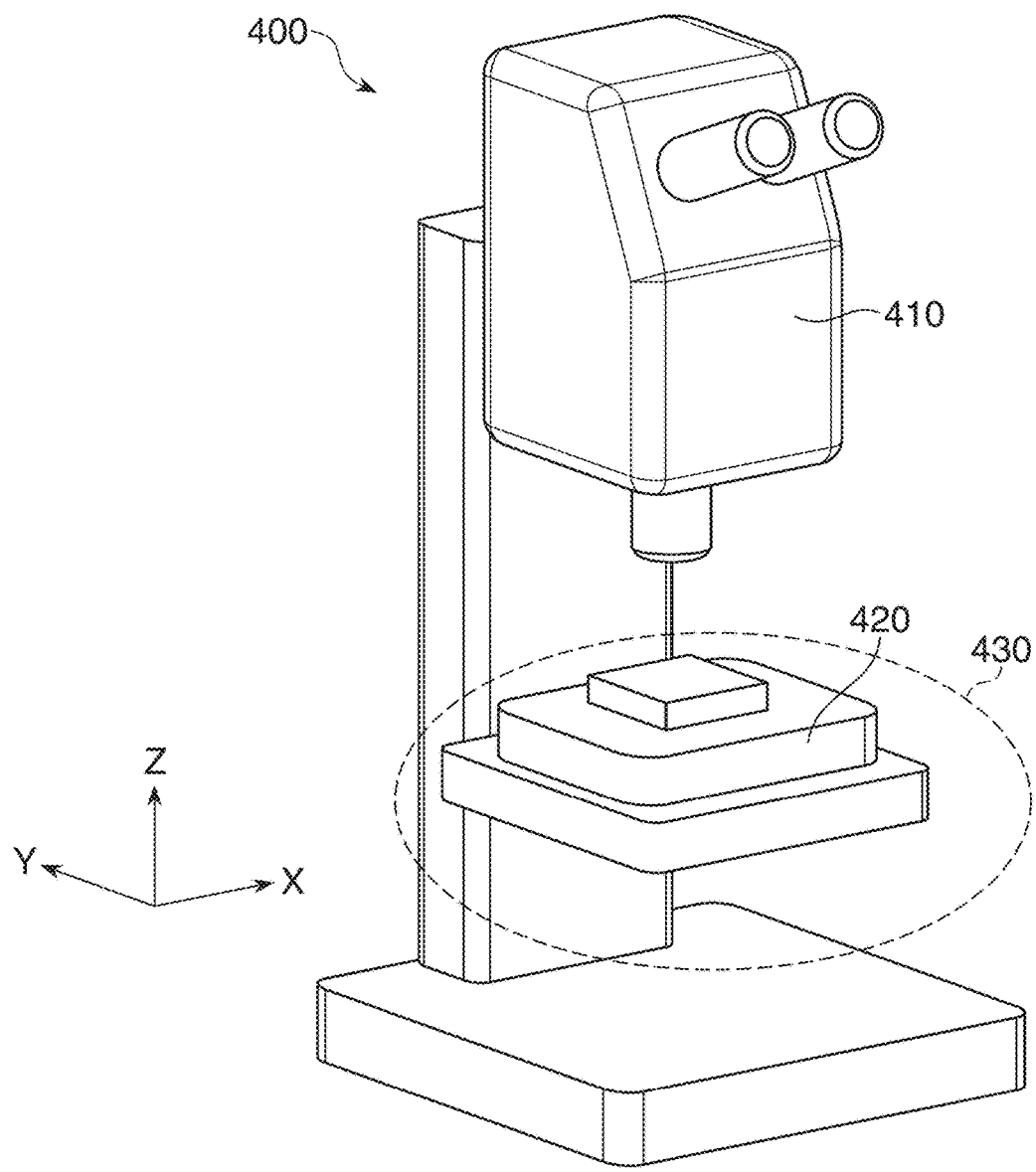
FIG. 19 is an appearance perspective view showing a microscope having the vibrating body in FIGS. 1A and 1B.

A description will now be given of a sixth embodiment of the present invention. In the following description of the sixth embodiment, a description will be given of an arrangement of a microscope having an X-Y stage, which is an exemplary electronic apparatus having the vibrating body 10 of the first embodiment described above. FIG. 19 is an appearance perspective view showing the microscope 400. The microscope 400 has an image pickup unit 410 in which an image pickup device and an optical system are incorporated, and an automatic stage 430, which is an exemplary stage device having a stage 420 provided on a base that is a driven body moved within an X-Y plane by at least two vibrating bodies 10. At least one of the vibrating bodies 10 is used to drive the stage 420 in an X direction and is placed such that the X direction of the vibrating body 10 corresponds to the X direction of the stage 420. Also, at least one of the vibrating bodies 10 is used to drive the stage 420 in a Y direction and is placed such that the X direction of the vibrating body 10 corresponds to the Y direction of the stage 420. How to drive the vibrating body 10 has already been described, and hence description thereof is omitted here.

An object to be observed is placed on an upper surface of the stage 420, and a magnified image is shot by the image pickup unit 410. When an observation range is wide, the operation of the two vibrating bodies 10 is controlled to move the stage 420 in a desired direction within the XY plane and then position the stage 420, and the object to be observed is shot. Many images are shot in this way, and the shot images are combined together through image processing using a computer, not shown, to obtain a high-definition image with a wide observation range.

Seventh Embodiment

Figure 20A:
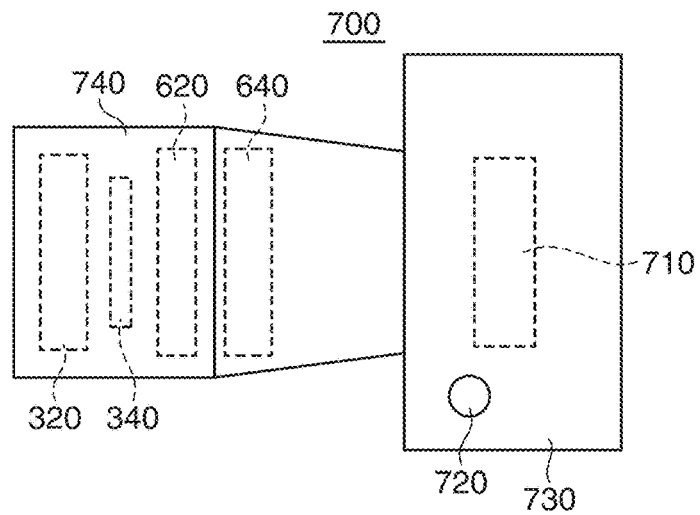
FIGS. 20A and 20B are a top view and a block diagram, respectively, schematically showing an arrangement of an image pickup apparatus having the vibrating body in FIGS. 1A and 1B.

Next, a description will be given of a seventh embodiment of the present invention. In the following description of the seventh embodiment, an image pickup apparatus which is an exemplary electronic apparatus having the vibrating body 10 of the first embodiment described above will be described. FIG. 20A is a top view schematically showing an arrangement of the image pickup apparatus 700. The image pickup apparatus 700 has a camera main body 730 equipped with an image pickup device 710 and a power button 720. The image pickup apparatus 700 also has a lens barrel 740 that has a first lens group (not shown), a second lens group 320, a third lens group (not shown), a fourth lens group 340, and vibration-type drive units 620 and 640. The lens barrel 740 is replaceable as an interchangeable lens, and the lens barrel 740 suitable for an object of shooting is allowed to be mounted on the camera main body 730. In the image pickup apparatus 700, the two vibration-type drive units 620 and 640 drive the second lens group 320 and the fourth lens group 340, respectively.

The vibration-type drive unit 620 has the vibrating body 10 of the first embodiment described above, an annular driven body, and a drive circuit that applies drive signals to the piezoelectric element 12 of the vibrating body 10. The driven body is disposed inside the lens barrel 740 such that its radial direction is substantially perpendicular to an optical axis. The driven body has a sliding surface that is substantially perpendicular to an optical axis when it is placed inside the lens barrel 740. For example, the three vibrating bodies 10 are fixed to an annular base at regular intervals on a circumference around the optical axis so that their respective contact portions 14 can be brought into pressure contact with the sliding surface of the driven body to apply frictional driving force (thrust) to the driven body in direction of a tangent to a circle around the optical axis. It should be noted that how to drive the vibrating body 10 has already been described, and hence description thereof is omitted here. With the arrangement described above, the vibration-type drive unit 620 moves the second lens group 320 in the direction of the optical axis by rotating the driven body about the optical axis and converting rotational output from the driven body to a straight-ahead motion in the direction of the optical axis through a gear or the like, not shown. The vibration-type drive unit 640 has the same arrangement as that of the vibration-type drive unit 620 to move the fourth lens group 340 in the direction of the optical axis.

Figure 20B:
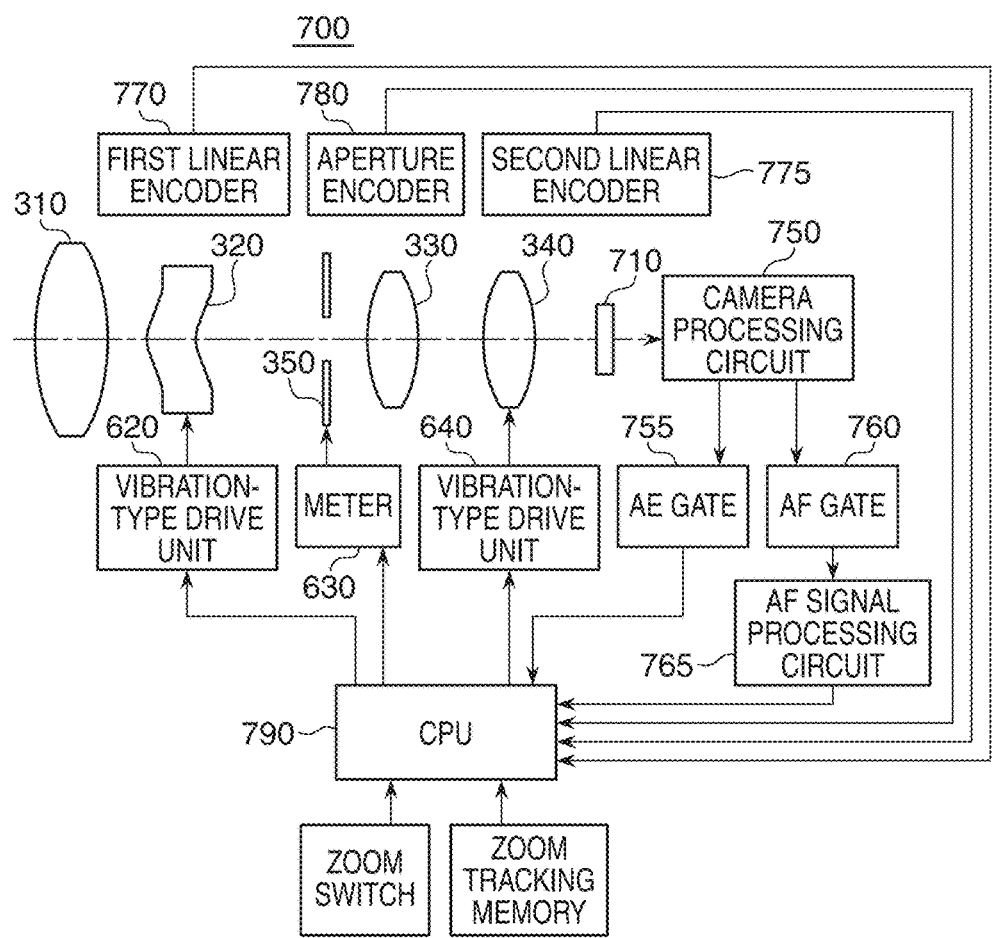

FIG. 20B is a block diagram schematically showing an arrangement of the image pickup apparatus 700. The first lens group 310, the second lens group 320, the third lens group 330, the fourth lens group 340, and a light amount adjustment unit 350 are placed at predetermined locations on the optical axis inside the lens barrel 740. Light that has passed through the first lens group 310 to the fourth lens group 340 and the light amount adjustment unit 350 forms an image on the image pickup device 710. The image pickup device 710 converts an optical image into an electric signal and outputs the electric signal, which in turn is sent to a camera processing circuit 750.

The camera processing circuit 750 subjects an output signal from the image pickup device 710 to amplification, gamma correction, and so forth. The camera processing circuit 750 is connected to a CPU 790 via an AE gate 755 and is connected to the CPU 790 via an AF gate 760 and an AF signal processing circuit 765. A picture signal subjected to predetermined processing by the camera processing circuit 750 is sent to the CPU 790 through the AE gate 755, the AF gate 760, and the AF signal processing circuit 765. It should be noted that the AF signal processing circuit 765 extracts high-frequency components from the picture signal to generate an evaluation value signal for auto focusing (AF) and supplies the generated evaluation value to the CPU 790.

The CPU 790 is a control circuit that controls the overall operation of the image pickup apparatus 700 and generates control signals, which are for use in determining exposure and focusing, from obtained picture signals. The CPU 790 adjusts the positions of the second lens group 320, the fourth lens group 340, and the light amount adjustment unit 350 in the direction of the optical axis by controlling the operation of the vibration-type drive units 620 and 640 and a meter 630 so that a determined exposure and an appropriate focusing state can be obtained. Under the control of the CPU 790, the vibration-type drive unit 620 moves the second lens group 320 in the direction of the optical axis, the vibration-type drive unit 640 moves the fourth lens group 340 in the direction of the optical axis, and the light amount adjustment unit 350 is drivingly controlled by the meter 630.

The position of the second lens group 320, which is driven by the vibration-type drive unit 620, in the direction of the optical axis is detected by a first linear encoder 770, and the CPU 790 is notified of the detection result, which in turn is fed back to the operation of the vibration-type drive unit 620. Likewise, the position of the fourth lens group 340, which is driven by the vibration-type drive unit 640, in the direction of the optical axis is detected by a second linear encoder 775, and the CPU 790 is notified of the detection result, which in turn is fed back to the operation of the vibration-type drive unit 640. The position of the light amount adjustment unit 350 in the direction of the optical axis is detected by an aperture encoder 780, and the CPU 790 is notified of the detection result, which in turn is fed back to the operation of the meter 630.

When a vibration-type actuator is used for the purpose of moving a predetermined lens group of the image pickup apparatus 700 in the direction of the optical axis, great holding force is maintained even when the lens group is at a standstill. As a result, the lens group is prevented from being displaced even when external force acts on the lens barrel and the main body of the image pickup apparatus.

The example in which a lens group is moved in the direction of the optical axis using the vibration-type drive units 620 and 640 having an annular driven body has been described, but an arrangement for moving a lens group in the direction of the optical axis using a vibration-type actuator (vibrating body) is not limited to this. For example, the vibrating body 10 may linearly drive the driven body 2. Thus, by mounting a holding member, which is holding a lens, on a driven body such that the direction of the optical axis of the lens and the direction in which the driven body is driven are substantially parallel, a lens group is moved in the direction of the optical axis and positioned. Also, when an image stabilization lens is incorporated in a lens barrel, the vibrating body 10 is used for an image stabilization unit that moves the image stabilization lens in an arbitrary direction within a plane substantially perpendicular to the optical axis. In this case, one or more vibrating bodies 10 which drive the lens holding member should be placed so as to move the lens holding member in two directions perpendicular to each other within the plane substantially perpendicular to the optical axis. The image stabilization unit should not necessarily be configured to drive the image stabilization lens but may be configured to move the image pickup device 710, which is incorporated in the main body of the image pickup apparatus, in an arbitrary direction within the plane perpendicular to the optical axis.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, in the above description, the microscope 400 and the image pickup apparatus 700 are taken as examples of electronic apparatuses using the vibrating body 10, but the vibrating body 10 may be applied to other electronic apparatuses. For example, the image pickup apparatus 700 is configured such that rotational driving force is obtained using the vibrating body 10. Rotational driving force thus obtained using the vibrating body 10 may be applied to drive, for example, a photosensitive drum of an image forming apparatus or rotatively drive an arm of a jointed-arm robot.

This application claims the benefit of Japanese Patent Application No. 2016-006092, filed Jan. 15, 2016, which is hereby incorporated by reference herein in its entirety.

What is claimed is:

1. A vibration-type actuator comprising:
a vibrating body configured to comprise a rectangular flat-shaped elastic body, an electro-mechanical energy conversion element that is joined to one surface of the elastic body, and at least one projecting portion that is provided on the elastic body; and
a driven body configured to be brought into pressure contact with the vibrating body at an end of the projecting portion,
wherein in the vibrating body, vibrations in a first bending vibration mode, in which there are two nodal lines that do not cross each other but cross short sides of the elastic body, and there is no nodal line that connects two long sides of the elastic body to each other, are excited, and vibrations in a second bending vibration mode, in which an amplitude peak of vibration in an out-of-plane direction of a flat-shaped plane of the elastic body is present in each of a total of six areas formed by dividing the flat-shaped plane of the elastic body into two in a lateral direction of the elastic body and dividing the flat-shaped plane of the elastic body into three in a longitudinal direction of the elastic body, and in adjoining areas of the six areas, vibrations at the amplitude peaks are in opposite phases, are excited, and
wherein driving vibrations obtained by combining vibrations in the first bending vibration mode and the second bending vibration mode generate an oval motion at the end of the projecting portion within a plane perpendicular to the longitudinal direction of the elastic body, causing the vibrating body and the driven body to move relatively to each other in the lateral direction of the elastic body.

2. The vibration-type actuator according to claim 1, wherein the two nodal lines of the first bending vibration mode do not cross at least one of the two long sides of the elastic body.

3. The vibration-type actuator according to claim 1, wherein the two nodal lines of the first bending vibration mode do not cross the two long sides of the elastic body.

4. The vibration-type actuator according to claim 1, wherein the second bending vibration mode has two nodal lines that do not cross each other but cross the long sides of the elastic body, and one nodal line that crosses the short sides of the elastic body.

5. The vibration-type actuator according to claim 4, wherein the two nodal lines of the second bending vibration mode do not cross the two short sides of the elastic body.

6. The vibration-type actuator according to claim 1,
wherein the vibrating body comprises one projecting portion, and
wherein the one projecting portion is provided in the elastic body such that an arbitrary point at an end of the one projecting portion corresponds to a center of gravity of the vibrating body as viewed from a pressing direction in which a pressing force from the driven body acts on the vibrating body.

7. The vibration-type actuator according to claim 6, wherein the one projecting portion is provided in a central part of the elastic body.

8. The vibration-type actuator according to claim 1,
wherein the vibrating body comprises two projecting portions, and
wherein the two projecting portions are provided in the elastic body such that a center of gravity of the vibrating body lies on a straight line that connects arbitrary points at respective ends of the two projecting portions together as viewed from a pressing direction in which a pressing force from the driven body acts on the vibrating body.

9. The vibration-type actuator according to claim 8, wherein the two projecting portions are provided close to the short sides of the elastic body and close to one nodal line of the second bending vibration mode which crosses the short sides of the elastic body.

10. The vibration-type actuator according to claim 8, wherein the two projecting portions are provided close to the two nodal lines of the first bending vibration mode which cross the short sides of the elastic body and midway between two nodal lines of the second bending vibration mode which cross the long sides of the elastic body.

11. The vibration-type actuator according to claim 1,
wherein the vibrating body comprises at least three projecting portions provided close to the short sides of the elastic body, and
wherein the at least three projecting portions are provided in the elastic body such that a center of gravity of the vibrating body lies inside an area that connects arbitrary points at respective ends of the at least three projecting portions to one another as viewed from a pressing direction in which a pressing force from the driven body acts on the vibrating body.

12. The vibration-type actuator according to claim 11, wherein four projecting portions are provided close to the short sides of the elastic body and close to the two nodal lines of the first bending vibration mode which cross the short sides of the elastic body.

13. The vibration-type actuator according to claim 9, wherein the projecting portions are provided in the elastic body such that at least a part of the projecting portions does not overlap the electro-mechanical energy conversion element as viewed from a thickness direction of the elastic body.

14. The vibration-type actuator according to claim 1, wherein the projecting portion is formed integrally with the elastic body.

15. An electronic apparatus comprising:
a vibration-type actuator configured to have a vibrating body and a driven body that move relatively to each other; and
a member configured to be joined to one of the vibrating body and the driven body, which is moved by operation of the vibration-type actuator, and moved to and positioned at a predetermined position by operation of the vibration-type actuator,
wherein the vibration-type actuator comprises the vibrating body having a rectangular flat-shaped elastic body, an electro-mechanical energy conversion element that is joined to one surface of the elastic body, and at least one projecting portion that is provided on the elastic body, and the driven body that is brought into pressure contact with the vibrating body at an end of the projecting portion,
wherein in the vibrating body, vibrations in a first bending vibration mode, in which there are two nodal lines that do not cross each other but cross short sides of the elastic body, and there is no nodal line that connects two long sides of the elastic body to each other, are excited, and vibrations in a second bending vibration mode in which an amplitude peak of vibration in an out-of-plane direction of a flat-shaped plane of the elastic body is present in each of a total of six areas formed by dividing the flat-shaped plane of the elastic body into two in a lateral direction of the elastic body and dividing the flat-shaped plane of the elastic body into three in a longitudinal direction of the elastic body, and in adjoining areas of the six areas, vibrations at the amplitude peaks are in opposite phases, are excited, and
wherein driving vibrations obtained by combining vibrations in the first bending vibration mode and the second bending vibration mode generate an oval motion at the end of the projecting portion within a plane perpendicular to the longitudinal direction of the elastic body, causing the vibrating body and the driven body to move relatively to each other in the lateral direction of the elastic body.

16. A vibration-type actuator comprising:
a vibrating body having a rectangular flat-shaped elastic body provided with at least one projecting portion and an electro-mechanical energy conversion element; and
a driven body in contact with the vibrating body,
wherein in the vibrating body, vibrations in a first bending vibration mode having two nodal lines that cross short sides of the elastic body are excited, and vibrations in a second bending vibration mode, which are secondary torsional vibrations, having one nodal line that crosses the short sides of the elastic body, are excited.

17. The vibration-type actuator according to claim 16, wherein the vibrating body and the driven body move relatively to each other in a lateral direction of the elastic body.

18. The vibration-type actuator according to claim 16,
wherein the vibrating body comprises one projecting portion, and
wherein the one projecting portion is provided at a central part of the elastic body.

19. The vibration-type actuator according to claim 16,
wherein the vibrating body comprises two projecting portions, and
wherein the two projecting portions are provided in the elastic body such that a center of gravity of the vibrating body lies on a straight line that connects arbitrary points at respective ends of the two projecting portions together as viewed from a pressing direction in which a pressing force from the driven body acts on the vibrating body.

20. An electronic apparatus comprising:
a vibration-type actuator; and
a member configured to be joined to the vibration-type actuator,
wherein the vibration-type actuator comprises a vibrating body having a rectangular flat-shaped elastic body provided with at least one projecting portion and an electro-mechanical energy conversion element, and a driven body in contact with the vibrating body,
wherein in the vibrating body, vibrations in a first bending vibration mode having two nodal lines that cross short sides of the elastic body are excited, and vibrations in a second bending vibration mode, which are secondary torsional vibrations, having one nodal line that crosses the short sides of the elastic body, are excited.

* * * * *